(12) United States Patent
Morikawa et al.

(10) Patent No.: US 12,276,027 B2
(45) Date of Patent: Apr. 15, 2025

(54) SUBSTRATE PROCESSING APPARATUS AND SUBSTRATE PROCESSING METHOD

(71) Applicant: Tokyo Electron Limited, Tokyo (JP)

(72) Inventors: Katsuhiro Morikawa, Koshi (JP); Masami Akimoto, Koshi (JP); Mitsuaki Iwashita, Nirasaki (JP); Satoshi Kaneko, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 714 days.

(21) Appl. No.: 17/598,597

(22) PCT Filed: Mar. 24, 2020

(86) PCT No.: PCT/JP2020/012979
§ 371 (c)(1),
(2) Date: Sep. 27, 2021

(87) PCT Pub. No.: WO2020/196506
PCT Pub. Date: Oct. 1, 2020

(65) Prior Publication Data
US 2022/0154342 A1 May 19, 2022

(30) Foreign Application Priority Data
Mar. 28, 2019 (JP) ................ 2019-063372

(51) Int. Cl.
*C23C 18/16* (2006.01)
*C23C 18/18* (2006.01)
(Continued)

(52) U.S. Cl.
CPC ........ *C23C 18/1689* (2013.01); *C23C 18/163* (2013.01); *C23C 18/1827* (2013.01);
(Continued)

(58) Field of Classification Search
None
See application file for complete search history.

(56) References Cited

U.S. PATENT DOCUMENTS 5,942,013 A * 8/1999 Akimoto ........... H01L 21/67754
414/217
6,068,002 A * 5/2000 Kamikawa ........ H01L 21/67781
134/107
(Continued)

FOREIGN PATENT DOCUMENTS

JP 2007-107101 A 4/2007
JP 2018-003097 A 1/2018
(Continued)

OTHER PUBLICATIONS

International Search Report for PCT/JP2020/012979 dated Jun. 23, 2020.

*Primary Examiner* — Jethro M. Pence
(74) *Attorney, Agent, or Firm* — Chrisman Gallo Tochtrop LLC

(57) ABSTRACT

A substrate processing apparatus includes a liquid processing module, provided with a carry-out/in opening of a substrate, including therein a first liquid processing device and a second liquid processing device; a module-outside transfer device configured to carry the substrate out from and into the liquid processing module; and a module-inside transfer device configured to transfer the substrate between the first liquid processing device and the second liquid processing device. The first liquid processing device is equipped with a first holder configured to hold the substrate. The second liquid processing device is equipped with a second holder configured to hold the substrate. The second liquid processing device is configured to perform a plating processing on the substrate held by the second holder. The first liquid processing device is configured to perform at
(Continued)

least a post-cleaning processing performed after the plating processing on the substrate held by the first holder.

11 Claims, 26 Drawing Sheets

(51) Int. Cl.
  *H01L 21/02* (2006.01)
  *H01L 21/288* (2006.01)
  *H01L 21/67* (2006.01)
  *H01L 21/677* (2006.01)
(52) U.S. Cl.
  CPC ...... *H01L 21/02068* (2013.01); *H01L 21/288* (2013.01); *H01L 21/6723* (2013.01); *H01L 21/67748* (2013.01)

(56) References Cited

U.S. PATENT DOCUMENTS

| | | | | |
|---|---|---|---|---|
| 6,342,104 B1* | 1/2002 | Kamikawa | H01L 21/67051 | 134/28 |
| 6,647,642 B2* | 11/2003 | Kamikawa | H01L 21/67051 | 34/232 |
| 7,087,117 B2* | 8/2006 | Katsuoka | H01L 21/67126 | 134/199 |
| 7,442,257 B2* | 10/2008 | Katsuoka | C25D 7/123 | 269/21 |
| 7,530,749 B2* | 5/2009 | Yamamoto | H01L 21/67034 | 396/611 |
| 7,681,521 B2* | 3/2010 | Nishibayashi | H01L 21/6719 | 118/712 |
| 7,789,577 B2* | 9/2010 | Matsuoka | H01L 21/6715 | 396/604 |
| 7,901,514 B2* | 3/2011 | Nakamura | B08B 3/02 | 134/32 |
| 8,057,114 B2* | 11/2011 | Hayashida | H01L 21/67051 | 396/611 |
| 8,154,106 B2* | 4/2012 | Ishida | G03F 7/70525 | 257/632 |
| 8,393,227 B2* | 3/2013 | Itoh | H01L 21/67017 | 73/861.44 |
| 8,443,513 B2* | 5/2013 | Ishida | H01L 21/67178 | 414/217 |
| 8,506,186 B2* | 8/2013 | Hayashi | H01L 21/67745 | 396/611 |
| 8,509,937 B2* | 8/2013 | Takuma | H01L 21/67745 | 700/285 |
| 8,590,548 B2* | 11/2013 | Eshima | H01L 21/6708 | 134/84 |
| 8,591,224 B2* | 11/2013 | Dong-Hun | H01L 21/67017 | 219/390 |
| 8,654,325 B2* | 2/2014 | Nakamizo | H01L 21/67259 | 356/237.1 |
| 8,757,089 B2* | 6/2014 | Hontake | G03F 7/40 | 118/623 |
| 8,817,225 B2* | 8/2014 | Matsuoka | G03F 7/16 | 118/52 |
| 8,888,387 B2* | 11/2014 | Matsuoka | H01L 21/6715 | 396/611 |
| 8,905,051 B2* | 12/2014 | Higashijima | H01L 21/6719 | 134/33 |
| 8,978,670 B2* | 3/2015 | Minamida | H01L 21/6708 | 396/575 |
| 8,985,880 B2* | 3/2015 | Matsuoka | H01L 21/6715 | 396/611 |
| 9,052,610 B2* | 6/2015 | Ishida | G03F 7/70341 | |
| 9,202,731 B2* | 12/2015 | Kasai | H01L 21/67051 | |
| 9,224,283 B2* | 12/2015 | Kaneko | G05B 23/027 | |
| 9,387,520 B2* | 7/2016 | Ogata | B08B 3/04 | |
| 9,396,978 B2* | 7/2016 | Matsumoto | H01L 21/67276 | |
| 9,417,529 B2* | 8/2016 | Matsuoka | G03F 7/16 | |
| 9,460,947 B2* | 10/2016 | Matsuoka | G03F 7/162 | |
| 9,539,607 B2* | 1/2017 | Kuwahara | H01L 21/67259 | |
| 9,716,002 B2* | 7/2017 | Takiguchi | H01L 21/67051 | |
| 9,953,826 B2* | 4/2018 | Kaneko | H01L 21/02052 | |
| 9,960,063 B2* | 5/2018 | Hayashi | H01L 21/67259 | |
| 10,115,609 B2* | 10/2018 | Mitsuoka | H01L 21/02101 | |
| 10,474,139 B2* | 11/2019 | Takimoto | G05B 19/41875 | |
| 10,734,255 B2* | 8/2020 | Sekiguchi | H01L 21/67028 | |
| 10,811,283 B2* | 10/2020 | Kaneko | H01L 21/02057 | |
| 10,916,472 B2* | 2/2021 | Clark | H01L 21/67184 | |
| 10,950,465 B2* | 3/2021 | Kitayama | B08B 5/00 | |
| 11,101,173 B2* | 8/2021 | Clark | H01L 21/76832 | |
| 11,139,181 B2* | 10/2021 | Inadomi | H01L 21/67745 | |
| 11,208,725 B2* | 12/2021 | Mizunaga | B05C 13/02 | |
| 11,256,180 B2* | 2/2022 | Hsieh | G03F 7/3021 | |
| 11,273,464 B2* | 3/2022 | Shimmura | B05C 11/10 | |
| 11,367,630 B2* | 6/2022 | Kaneko | H01L 21/02057 | |
| 11,430,673 B2* | 8/2022 | Hashimoto | B08B 3/08 | |
| 11,446,588 B2* | 9/2022 | Goshi | B05C 11/1013 | |
| 11,574,827 B2* | 2/2023 | Iino | H01L 21/304 | |
| 11,664,254 B2* | 5/2023 | Watanabe | G03F 7/16 | 414/806 |
| 11,715,656 B2* | 8/2023 | Chang | H01L 21/67017 | 438/8 |
| 11,752,515 B2* | 9/2023 | Kajiwara | H10K 71/12 | 118/313 |
| 11,819,872 B2* | 11/2023 | Yamaguchi | G03F 7/168 | |
| 11,833,551 B2* | 12/2023 | Seki | C25D 17/06 | |
| 11,923,220 B2* | 3/2024 | Okamura | H01L 21/67023 | |
| 2006/0243204 A1* | 11/2006 | Katsuoka | C23C 18/1893 | 118/66 |
| 2010/0232781 A1* | 9/2010 | Hontake | G03F 7/0035 | 396/611 |
| 2012/0034369 A1* | 2/2012 | Ito | G03F 7/16 | 118/712 |
| 2014/0283887 A1* | 9/2014 | Tanaka | H01L 21/67028 | 134/58 R |
| 2015/0099355 A1 | 4/2015 | Inatomi et al. | | |
| 2015/0147476 A1 | 5/2015 | Mizutani et al. | | |
| 2015/0258466 A1* | 9/2015 | Mitsuoka | H01L 21/02101 | 134/99.1 |
| 2015/0258584 A1* | 9/2015 | Mitsuoka | H01L 21/02101 | 202/175 |
| 2020/0006100 A1* | 1/2020 | Clark | H01L 21/68707 | |
| 2020/0043764 A1* | 2/2020 | Clark | H01L 22/12 | |
| 2020/0083070 A1* | 3/2020 | Clark | H01L 21/67161 | |
| 2020/0083080 A1* | 3/2020 | Clark | H01L 22/12 | |
| 2021/0043482 A1* | 2/2021 | Okamura | G01N 21/9501 | |
| 2022/0076968 A1* | 3/2022 | Marumoto | H01L 21/02019 | |
| 2022/0093446 A1* | 3/2022 | Ikeue | H01L 21/67259 | |
| 2022/0165597 A1* | 5/2022 | Watanabe | H01L 21/67736 | |
| 2022/0277968 A1* | 9/2022 | Kaneko | H01L 21/02057 | |
| 2022/0395874 A1* | 12/2022 | Takahashi | B08B 3/02 | |
| 2023/0264233 A1* | 8/2023 | Kosai | H01L 21/67017 | 210/805 |
| 2023/0326772 A1* | 10/2023 | Chang | H01L 21/67253 | 438/8 |
| 2024/0050992 A1* | 2/2024 | Seki | H01L 21/67057 | |
| 2024/0152052 A1* | 5/2024 | Tanaka | H01L 21/67051 | |

FOREIGN PATENT DOCUMENTS

| | | |
|---|---|---|
| KR | 10-2001-0109299 A | 12/2001 |
| WO | 2013/140938 A1 | 9/2013 |

* cited by examiner

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2020/012979 filed on Mar. 24, 2020, which claims the benefit of Japanese Patent Application No. 2019-063372 filed on Mar. 28, 2019, the entire disclosures of which are incorporated herein by reference.

TECHNICAL FIELD

The various aspects and exemplary embodiments described herein pertain generally to a substrate processing apparatus and a substrate processing method.

BACKGROUND

To form a wiring layer of a semiconductor device, an electroless plating processing is performed. Patent Document 1 discloses a single-wafer type substrate processing apparatus for performing an electroless plating processing. In the substrate processing apparatus of Patent Document 1, the electroless plating processing is performed by rotating a substrate held by a substrate holder at a low rotational speed or stopping the rotation of the substrate to accumulate a plating liquid on a surface of the substrate and then heating the plating liquid. The plating liquid is heated by driving a heater provided in a cover body that is movable up and down in a state where the substrate is covered by the cover body. In the substrate processing apparatus of Patent Document 1, before the electroless plating processing, the substrate held by the substrate holder is cleaned and rinsed while being rotated, and after the electroless plating processing, the substrate held by the substrate holder is rinsed and dried while being rotated.

Patent Document 1: Japanese Patent Laid-open Publication No. 2018-003097

SUMMARY

Means for Solving the Problems

In an exemplary embodiment, a substrate processing apparatus includes a liquid processing module, provided with a carry-out/in opening of a substrate, including therein a first liquid processing device and a second liquid processing device provided at a position farther from the carry-out/in opening than the first liquid processing device; a module-outside transfer device configured to carry the substrate out from and into the liquid processing module; and a module-inside transfer device configured to transfer the substrate between the first liquid processing device and the second liquid processing device. The first liquid processing device is equipped with a first holder configured to hold the substrate. The second liquid processing device is equipped with a second holder configured to hold the substrate. The second liquid processing device is configured to perform a plating processing on the substrate held by the second holder. The first liquid processing device is configured to perform at least a post-cleaning processing performed after the plating processing on the substrate held by the first holder.

DETAILED DESCRIPTION

Figure 1:
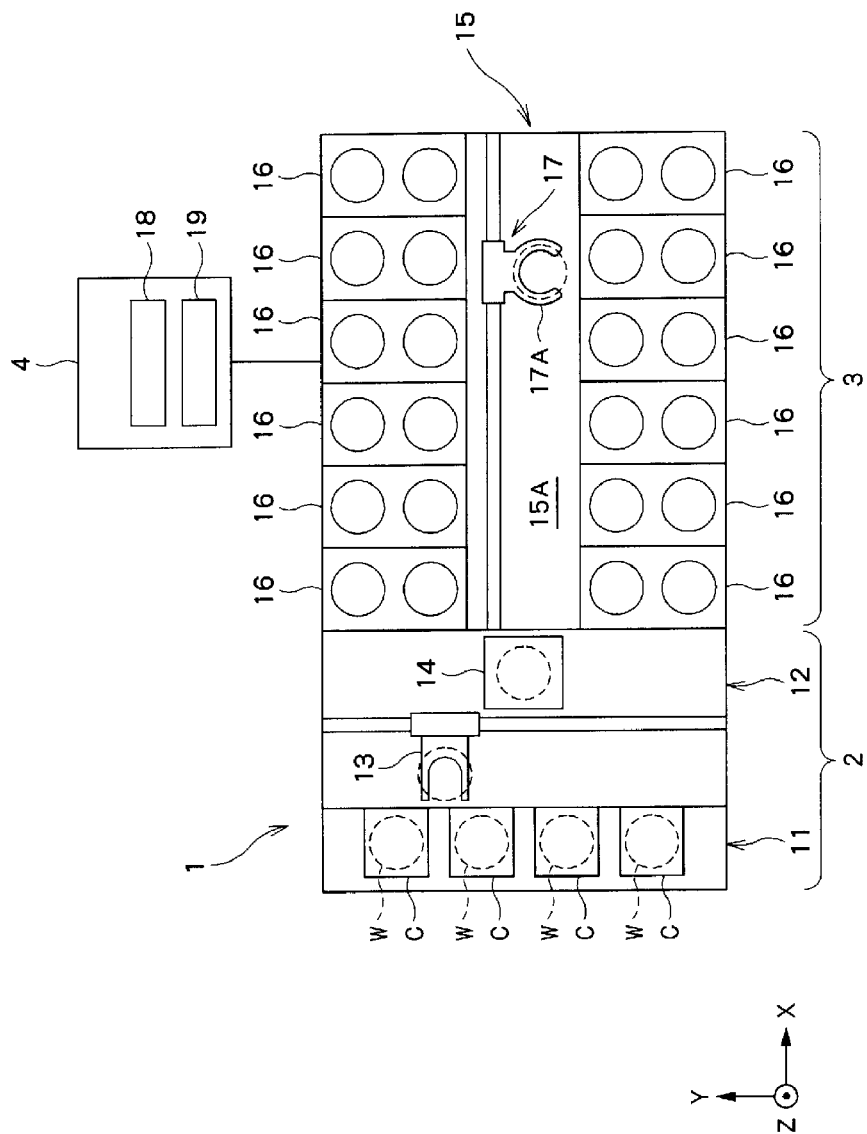
FIG. 1 is a schematic plan view illustrating an outline of a substrate processing system according to an exemplary embodiment of a substrate processing apparatus.

A substrate processing system as an exemplary embodiment of a substrate processing apparatus will be described with reference to the accompanying drawings. FIG. 1 is a plan view schematically illustrating an outline of a substrate processing system according to the present exemplary embodiment. In the following, in order to clarify positional relationships, the X-axis, the Y-axis and the Z-axis which are orthogonal to each other will be defined. The positive Z-axis direction will be regarded as a vertically upward direction.

As shown in FIG. 1, a substrate processing system 1 includes a carry-in/out station 2 and a processing station 3. The carry-in/out station 2 and the processing station 3 are provided adjacent to each other.

The carry-in/out station 2 is equipped with a carrier placing section 11 and a transfer section 12. In the carrier placing section 11, a plurality of carriers C is placed to horizontally accommodate a plurality of substrates, i.e., semiconductor wafers W (hereinafter, referred to as "wafers W") in the present exemplary embodiment.

The transfer section 12 is provided adjacent to the carrier placing section 11 and equipped with a substrate transfer device 13 and a delivery unit 14. The substrate transfer device 13 is equipped with a wafer holding mechanism configured to hold the wafer W. Further, the substrate transfer device 13 is movable in a Y-axis direction (a first horizontal direction) and a Z-axis direction (a vertical direction) and pivotable around a vertical axis and transfers the wafers W between the carriers C and the delivery unit 14 by using the wafer holding mechanism.

The processing station 3 is provided adjacent to the transfer section 12. The processing station 3 is equipped with a transfer section 15 and a plurality of liquid processing modules 16. The plurality of liquid processing modules 16 is arranged in an X-axis direction (a second horizontal direction) at both sides of the transfer section 15.

The transfer section 15 is provided therein with a transfer path 15A extending in the X-axis direction (second horizontal direction) and a substrate transfer device (a module-outside transfer device) 17 provided inside the transfer path 15A. The substrate transfer device 17 is equipped with a wafer holding mechanism configured to hold the wafer W. Further, the substrate transfer device 17 is movable in the second horizontal direction (X-axis direction) and the vertical direction (Z-axis direction) and pivotable around a vertical axis. The substrate transfer device 17 has a transfer arm 17A configured to hold the wafer W and transfers the wafers W between the delivery unit 14 and any one of the liquid processing modules 16 by using the transfer arm 17A.

Each of the liquid processing modules 16 is configured to perform a predetermined liquid processing on the wafer W transferred by the substrate transfer device 17 (to be described in detail below).

Further, the substrate processing system 1 is equipped with a control device 4. The control device 4 is, for example, a computer and includes a controller 18 and a storage 19. The storage 19 stores therein a program that controls various processings performed in the substrate processing system 1. The controller 18 controls the operations of the substrate processing system 1 by reading and executing the program stored in the storage 19.

Further, the program may be recorded in a computer-readable recording medium and may be installed from the recording medium to the storage 19 of the control device 4. The computer-readable recording medium may be, for example, a hard disk (HD), a flexible disk (FD), a compact disk (CD), a magneto optical disc (MO), a memory card, or the like.

In the substrate processing system 1 configured as described above, the substrate transfer device 13 of the carry-in/out station 2 first takes out the wafer W from the carrier C placed in the carrier placing section 11 and then places the taken wafer W on the delivery unit 14. The wafer W placed on the delivery unit 14 is taken out from the delivery unit 14 by the substrate transfer device 17 of the processing station 3 and carried into the liquid processing module 16.

The wafer W carried into the liquid processing module 16 is processed by the liquid processing module 16, and then carried out from the liquid processing module 16 and placed on the delivery unit 14 by the substrate transfer device 17. After the processing of placing the wafer W on the delivery unit 14, the wafer W returns back to the carrier C of the carrier placing section 11 by the substrate transfer device 13.

Figure 2:
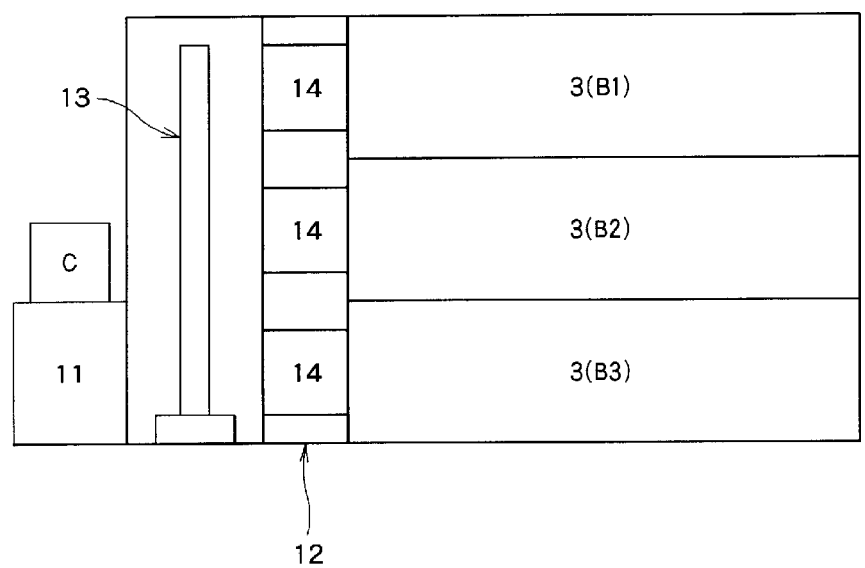
FIG. 2 is a schematic side view illustrating an outline of a substrate processing system according to another exemplary embodiment.

In the exemplary embodiment, as shown in FIG. 2, the processing station 3 may be configured by stacking a plurality of unit blocks B1, B2 and B3. Each of the unit blocks B1 to B3 has the same configuration as the processing station 3 illustrated in FIG. 1. In this case, a plurality of delivery units 14 is provided and each of the delivery units 14 is assigned to the corresponding unit block. The substrate transfer device 13 of the carry-in/out station 2 can transfer the wafer W between the carrier C and any one of the delivery units 14.

Hereinafter, a configuration of the liquid processing module 16 will be described mainly with reference to FIG. 3 and FIG. 4. The liquid processing module 16 has a housing 1601 covering the entire liquid processing module 16. In the housing 1601, a first liquid processing device 1000 and a second liquid processing device 2000 arranged linearly in the Y-axis direction are provided. The first liquid processing device 1000 is configured to perform at least a post-processing of a plating processing on the wafer W, and the second liquid processing device 2000 is configured to perform the plating processing on the wafer W. The first liquid processing device 1000 may also perform a pre-processing of the plating processing on the wafer W. Each of the plating processing, the pre-processing and the post-processing includes at least one process.

The housing 1601 has, at the side of the first liquid processing device 1000, only one carry-out/in opening 1602 through which a non-processed wafer W is carried into the liquid processing module 16 and a processed wafer W is carried out from the liquid processing module 16. The carry-out/in opening 1602 is equipped with a shutter 1603 for opening/closing the carry-out/in opening 1602. The transfer arm (substrate holder) 17A of the substrate transfer device (module-outside transfer device) 17 on which the wafer W is held can move in the Y-axis direction to enter the first liquid processing device 1000 through the carry-out/in opening 1602.

The first liquid processing device 1000 is equipped with a first rotational liquid processing unit 1001. The first rotational liquid processing unit 1001 is equipped with a first spin chuck 1002 (a first holder) configured to hold the wafer W. The first spin chuck 1002 can hold the wafer W horizontally and rotate the wafer W held thereon around a vertical axis line 1003.

The first spin chuck 1002 is configured as a mechanical chuck. The mechanical chuck is configured to hold the wafer W by gripping a periphery of the wafer W with a plurality of grip claws including at least one movable grip claw, as known in the field of semiconductor manufacturing apparatus.

The first spin chuck 1002 is equipped with a plurality of, e.g., three, lift pins (first supporting pins) 1004. The lift pins 1004 can move up and down while supporting a rear surface (a bottom surface) of the wafer W thereon.

The second liquid processing device 2000 is equipped with a second rotational liquid processing unit 2001. The second rotational liquid processing unit 2001 is equipped with a second spin chuck 2002 (a second holder) configured to hold the wafer W. The second spin chuck 2002 is configured to hold the wafer W horizontally and rotate the wafer W held thereon around a vertical axis line 2003.

The second spin chuck 2002 is configured as a vacuum chuck. The vacuum chuck is configured to hold the wafer W horizontally by attracting the rear surface of the wafer W. The second spin chuck 2002 illustrated in FIG. 3 corresponds to a rotary table 100 illustrated in FIG. 6 (to be described in detail below).

The second spin chuck 2002 is equipped with a plurality of, e.g., three, lift pins (second supporting pins) 2004. The lift pins 2004 can move up and down while supporting the rear surface (the bottom surface) of the wafer W thereon. The lift pins 2004 illustrated in FIG. 3 correspond to lift pins 211 illustrated in FIG. 6.

The liquid processing module 16 is provided therein with an exchange device (a module-inside transfer device) 3000 configured to exchange substrates between the first liquid processing device 1000 and the second liquid processing device 2000. In the illustrated exemplary embodiment, the exchange device 3000 is equipped with a first arm 3100 and a second arm 3200 provided between the first liquid processing device 1000 and the second liquid processing device 2000.

The first arm 3100 is provided at a base 3101 provided therein with a non-illustrated rotary actuator and pivotable around a vertical rotation axis 3102 (extending in the Z-axis direction) in a horizontal plane. A vacuum chuck 3103 is provided at a tip end of the first arm 3100. By pivoting the first arm 3100, a center of the vacuum chuck 3103, i.e., a center of the wafer W held on the vacuum chuck 3103, can be located at a first delivery position which coincides with the vertical axis line 1003 of the first spin chuck 1002 and a second delivery position which coincides with the vertical axis line 2003 of the second spin chuck 2002.

The second arm 3200 is also provided at a base 3201 provided therein with a non-illustrated rotary actuator and pivotable around a vertical rotation axis 3202 (extending in the Z-axis direction) in a horizontal plane. A vacuum chuck 3203 is provided at a tip end of the second arm 3200. By pivoting the second arm 3200, a center of the vacuum chuck 3203, i.e., a center of the wafer W held on the vacuum chuck 3203, can be located at a first delivery position which coincides with the vertical axis line 1003 of the first spin chuck 1002 and a second delivery position which coincides with the vertical axis line 2003 of the second spin chuck 2002.

The first arm 3100 and the second arm 3200 are located at different height positions. Thus, even when the first arm 3100 and the second arm 3200 are simultaneously moved in any ways, they do not interfere with each other. In the illustrated exemplary embodiment, the first arm 3100 is located at a lower position than the second arm 3200.

Figure 4:
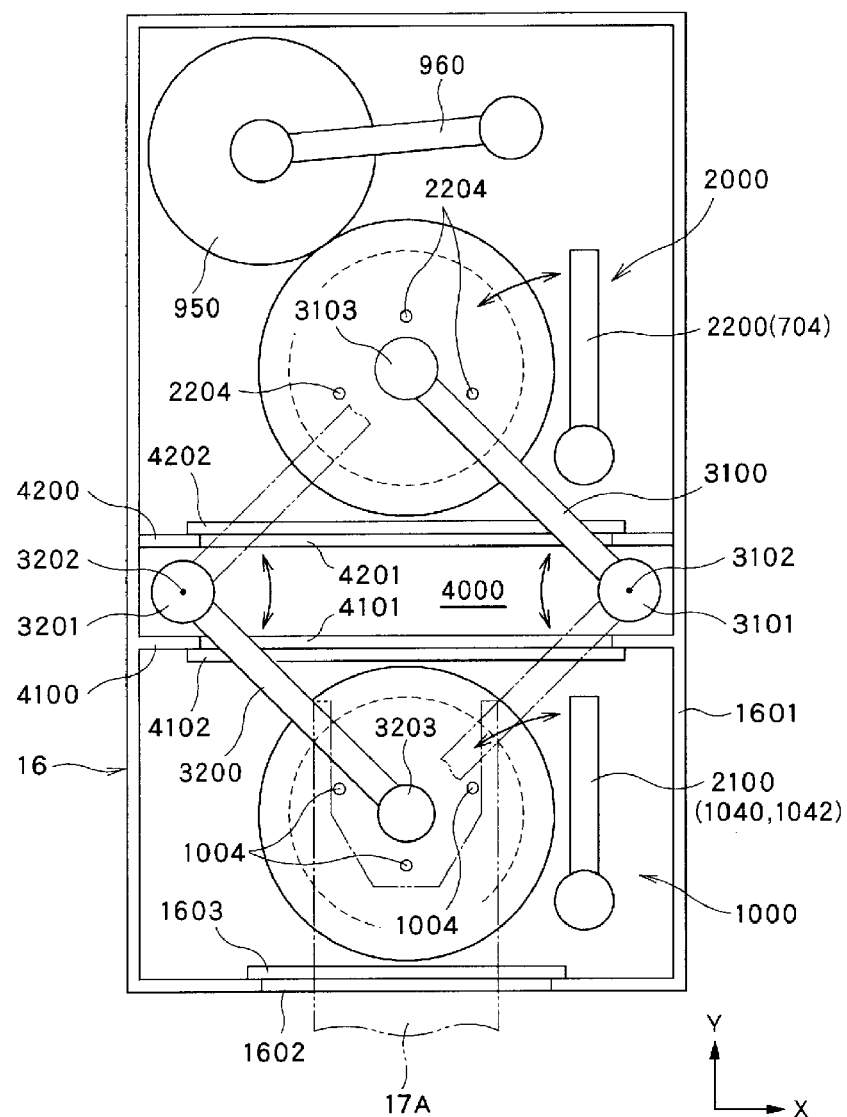
FIG. 4 is a schematic plan view of the liquid processing module shown in FIG. 3.

As can be understood from FIG. 4, the lift pins 1004 of the first spin chuck 1002 are provided at a position where the lift pins 1004 do not interfere with revolution trajectories of the first arm 3100 and the second arm 3200 regardless of height positions of the lift pins 1004. Likewise, the lift pins 2004 of the second spin chuck 2002 are provided at a position where the lift pins 2004 do not interfere with the revolution trajectories of the first arm 3100 and the second arm 3200 regardless of height positions of the lift pins 2004. Also, the lift pins 1004 of the first spin chuck 1002 are provided at a position where the lift pins 1004 do not interfere with a movement trajectory of the transfer arm 17A (having a horseshoe shape or bifurcated fork shape) that has entered the first liquid processing device 1000 to carry the wafer W out from and into the first liquid processing device 1000.

At least one partition wall, e.g., two partition walls 4100 and 4200 in the illustrated exemplary embodiment, are provided between the first liquid processing device 1000 and the second liquid processing device 2000. The partition walls 4100 and 4200 can isolate an atmosphere inside the first liquid processing device 1000 from an atmosphere inside the second liquid processing device 2000.

The partition wall 4100 is equipped with an opening 4101, and the opening 4101 is equipped with a shutter 4102 for opening/closing the opening 4101. Likewise, the partition wall 4200 is equipped with an opening 4201, and the opening 4201 is equipped with a shutter 4202 for opening/closing the opening 4201. By opening the shutters 4102 and 4202, the first arm 3100 and the second arm 3200 each holding the wafer W thereon can be moved between the first delivery position and the second delivery position through the openings 4101 and 4201, respectively.

An arm standby space 4000 is formed between the partition wall 4100 and the partition wall 4200. The base 3101 for the first arm 3100 and the base 3201 for the second arm 3200 are placed on both ends in the X-axis direction within the arm standby space 4000.

By closing the shutters 4102 and 4202 in a state where longitudinal directions of the first arm 3100 and the second arm 3200 are made coincide with the X-axis direction, the first arm 3100 and the second arm 3200 can be accommodated entirely in the arm standby space 4000. In this case, the first arm 3100 and the second arm 3200 are isolated from both the atmosphere inside the first liquid processing device 1000 and the atmosphere inside the second liquid processing device 2000.

Within the first liquid processing device 1000, a nozzle arm 2100 having one or more nozzles configured to supply, on the wafer W, processing fluids (a processing liquid and a processing gas) required for processings (pre-processing and post-processing of the plating processing) to be performed in the first liquid processing device 1000 is provided. Likewise, within the second liquid processing device 2000, a nozzle arm 2200 having one or more nozzles configured to supply, on the wafer W, processing fluids (a processing liquid and a processing gas) required for the plating processing to be performed in the second liquid processing device 2000 is provided. The nozzle arm 2200 shown in FIG. 4 corresponds to a nozzle arm 704 shown in FIG. 6.

Figure 5:
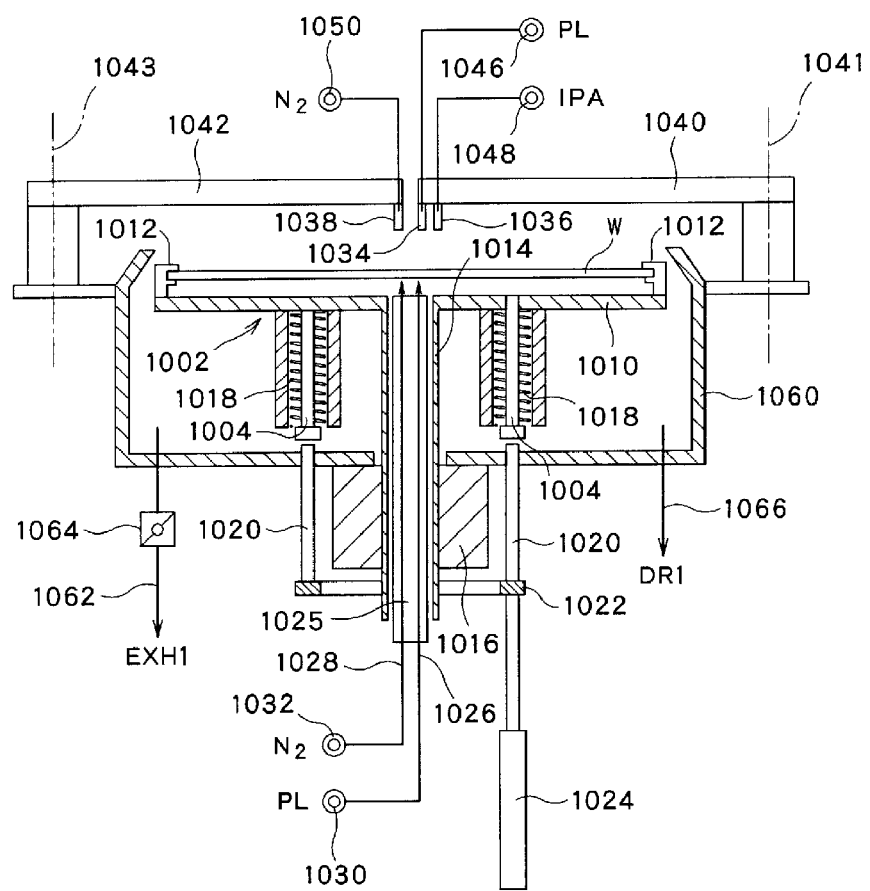
FIG. 5 is a schematic longitudinal cross sectional view illustrating an example configuration of a first liquid processing device of the liquid processing module shown in FIG. 3.

Hereinafter, a configuration of the first rotational liquid processing unit 1001 of the first liquid processing device 1000 will be described. The configuration of the first rotational liquid processing unit 1001 is well known in the art and thus will be described briefly with reference to the schematic diagram in FIG. 5.

As described above, the first rotational liquid processing unit 1001 is equipped with the first spin chuck 1002 (first holder). The first spin chuck 1002 is equipped with a circular plate-shaped base plate 1010 and a plurality of movable grip claws 1012 provided apart from each other in a circumferential direction on a peripheral portion of the base plate 1010. Each grip claw 1012 can be displaced to be in contact with or separated from the periphery of the wafer W by a non-illustrated grip claw opening/closing mechanism. The first spin chuck 1002 can hold the wafer W horizontally by gripping the periphery of the wafer W with the plurality of grip claws 1012.

A hollow rotational shaft 1014 extends vertically downwards from a central portion of a bottom surface of the base plate 1010. The rotational shaft 1014 is rotated and driven by a motor 1016, and, thus, the wafer W held on the first spin chuck 1002 can be rotated around the vertical axis line.

The base plate 1010 is equipped with through holes through which the lift pins 1004 pass. The lift pins 1004 are pressed down by springs 1018. The lift pins 1004 cannot be displaced to be lower than positions illustrated in FIG. 5 due to engaging protrusions that are not illustrated in FIG. 5.

Under the lift pins 1004, push rods 1020 are provided in the same number as the lift pins 1004. If the base plate 1010 is stopped at a specific angular position, the lift pins 1004 and the push rods 1020 are aligned vertically. Bottom ends of the push rods 1020 are fixed to a ring member 1022. A linear actuator 1024 including a ball screw, an air cylinder, etc. moves up the ring member 1022 so that the lift pins 1004 can be pushed up by the push rods 1020 to a desired height position.

Within the hollow rotational shaft 1014, a rod-shaped processing fluid supply member 1025 is provided. The processing fluid supply member 1025 is configured to maintain a non-rotation state even when the rotational shaft 1014 is rotated. The processing fluid supply member 1025 is provided therein with at least one processing liquid supply path 1026 (e.g., only one shown in FIG. 5 for simplification of illustration) extending in the vertical direction and a gas supply path 1028. Top ends of the processing liquid supply path 1026 and gas supply path 1028 are opened to a space under the central portion of the rear surface (bottom surface) of the wafer W.

The number of processing liquid supply paths 1026 depends on the number of kinds of processing liquids required for processing the rear surface (bottom surface) of the wafer W. Examples of processing liquids PL may include pure water (DIW) as a rinse liquid, an intermediate cleaning liquid and a post-cleaning liquid. In this case, three processing liquid supply paths 1026 may be independently provided. A single processing liquid supply path 1026 may be used for a plurality of kinds of processing liquids which may be mixed with each other. The processing liquid supply path 1026 is supplied with a processing liquid from a source 1030 of the processing liquid through a non-illustrated flow controller. The gas supply path 1028 is supplied with a nitrogen gas ($N_2$ gas) as a drying gas from a gas source 1032. Instead of the nitrogen gas, an inert gas may also be used as the drying gas. The processing liquid and the gas are discharged toward the rear surface (bottom surface) of the wafer W from the openings at the top ends of the processing fluid supply paths 1026 and 1028. That is, a top end portion of the processing fluid supply member 1025 serves as a bottom nozzle configured to discharge the processing fluid toward the rear surface of the wafer W.

The first liquid processing device 1000 is equipped with at least one processing liquid nozzle 1034 (e.g., only one shown in FIG. 5 for simplification of illustration) configured to supply the processing liquid PL onto a front surface (a top surface) of the wafer W held on the first spin chuck 1002, one drying liquid nozzle 1036 and one gas nozzle 1038. The processing liquid nozzle 1034 and the drying liquid nozzle 1036 are supported at a tip end portion of a first nozzle arm 1040. The gas nozzle 1038 is supported at a tip end portion of a second nozzle arm 1042.

The number of processing liquid nozzles 1034 depends on the number of kinds of processing liquids required for processing the front surface (top surface) of the wafer W. Examples of processing liquids PL may include a cleaning liquid for pre-processing, a cleaning liquid for post-processing, a cleaning liquid for intermediate cleaning, a catalyst solution, a rinse liquid (e.g., pure water) and a catalyst removing liquid. In this case, five processing liquid nozzles 1034 may be independently provided. A single processing liquid nozzle 1034 may be used for a plurality of kinds of processing liquids which may be mixed with each other.

As the cleaning liquid for pre-processing of the plating, an organic acid such as a formic acid, malic acid, a succinic acid, a citric acid or a malonic acid, a hydrofluoric acid (DHF) (aqueous solution of hydrogen fluoride) diluted to the extent that it does not corrode a plating target surface of the substrate, or tetramethylammonium hydroxide (TMAH) may be used. Some of the cleaning liquid may also be used for the post-processing of the plating or for the intermediate cleaning. A low concentration alkaline solution may be used for the post-processing on the front surface of the wafer W, or a mixed solution of malic acid and hydrogen peroxide may be used for the post-processing on the rear surface of the wafer W.

The catalyst solution may contain, for example, a metal catalyst in the form of particles, particularly, nanoparticles. Specifically, the catalyst solution contains a metal catalyst in the form of nanoparticles, a dispersant and water as a dispersion medium. The metal catalyst in the form of nanoparticles may be, for example, nanoparticle-shaped palladium (Pd). Further, the dispersant serves to allow the metal catalyst in the form of nanoparticles to be easily dispersed in the catalyst solution. The dispersant may be, for example, polyvinylpyrrolidone (PVP). The metal catalyst needs to have sufficient catalytic activity to an oxidation reaction of a reducing agent in a plating liquid. The catalyst may include, for example, an iron group element (Fe, Co, Ni), a platinum metal element (Ru, Rh, Os, Ir, Pt), Cu, Ag or Au in addition to Pd. The catalyst solution may contain an adsorption promoting agent which promotes adsorption of the catalyst to a surface of a material to which the catalyst is supplied.

As an example of the catalyst removing liquid, a reducing agent, desirably, the same reducing agent as the reducing agent contained in a plating liquid M1 may be used. The reducing agent may be, for example, dimethylamineborane (DMAB). The DMAB is used as the catalyst removing liquid after being diluted to about 100 times to about 1000 times with, for example, DIW (pure water).

The drying liquid nozzle 1036 supplies an organic solvent that can be easily replaced with the rinse liquid (e.g., pure water) (desirably having compatibility with pure water) and has a higher volatility and a lower surface tension than the rinse liquid. The organic solvent may be, for example, IPA (isopropyl alcohol).

A drying gas to be supplied by the gas nozzle 1038 may be an inert gas such as a nitrogen gas.

Each of the nozzles 1034, 1036 and 1038 are connected to supply mechanisms (detailed illustrations are omitted) of the processing fluids (processing liquid, drying liquid and drying gas). Each of the supply mechanisms may include a processing fluid source, a fluid line (passageway) connected to the processing fluid source and a flow controller provided in the fluid line. The processing fluid source is, for example, a factory power supply provided in a semiconductor device manufacturing factory where the substrate processing system 1 is installed. The processing fluid source may be a liquid storage tank or a gas bombe provided in the substrate processing system 1. The flow controller may be, for example, an opening/closing valve, a flowmeter, a flow rate control valve and the like. The flow controller enables each processing fluid to be supplied at a controlled flow rate to the wafer W.

The first and second nozzle arms 1040 and 1042 are pivotable around vertical axis lines 1041 and 1043, respectively, and, thus, the processing fluids can be supplied through the nozzles 1034, 1036 and 1038 to a certain position in a radial direction on the front surface of the wafer W held on the first spin chuck 1002. One of the nozzle arms 1040 and 1042 illustrated in FIG. 5 corresponds to the nozzle arm 2100 illustrated in FIG. 4, and any nozzle arm corresponding to the other nozzle arm is not illustrated in FIG. 4.

A liquid recovery cup 1060 is provided around the first spin chuck 1002. The liquid recovery cup 1060 is configured to collect the processing fluid (particularly, liquid) that has been supplied to the wafer W being rotated and then scattered from the wafer W. A bottom portion of the liquid recovery cup 1060 is connected to an exhaust passageway 1062 and a drain passageway 1066. The exhaust passageway 1062 is connected to a factory exhaust system EXH1 kept in a depressurized atmosphere. Thus, the atmosphere of an internal space of the liquid recovery cup 1060 is constantly suctioned. A flow rate control device 1064 such as an exhaust damper or a butterfly valve is provided in the exhaust passageway 1062, and, thus, it is possible to control an exhaust flow rate in the exhaust passageway 1062. The exhaust passageway 1062 may be equipped with an ejector. The drain passageway 1066 is connected to a factory drain passageway DR1.

Figure 3:
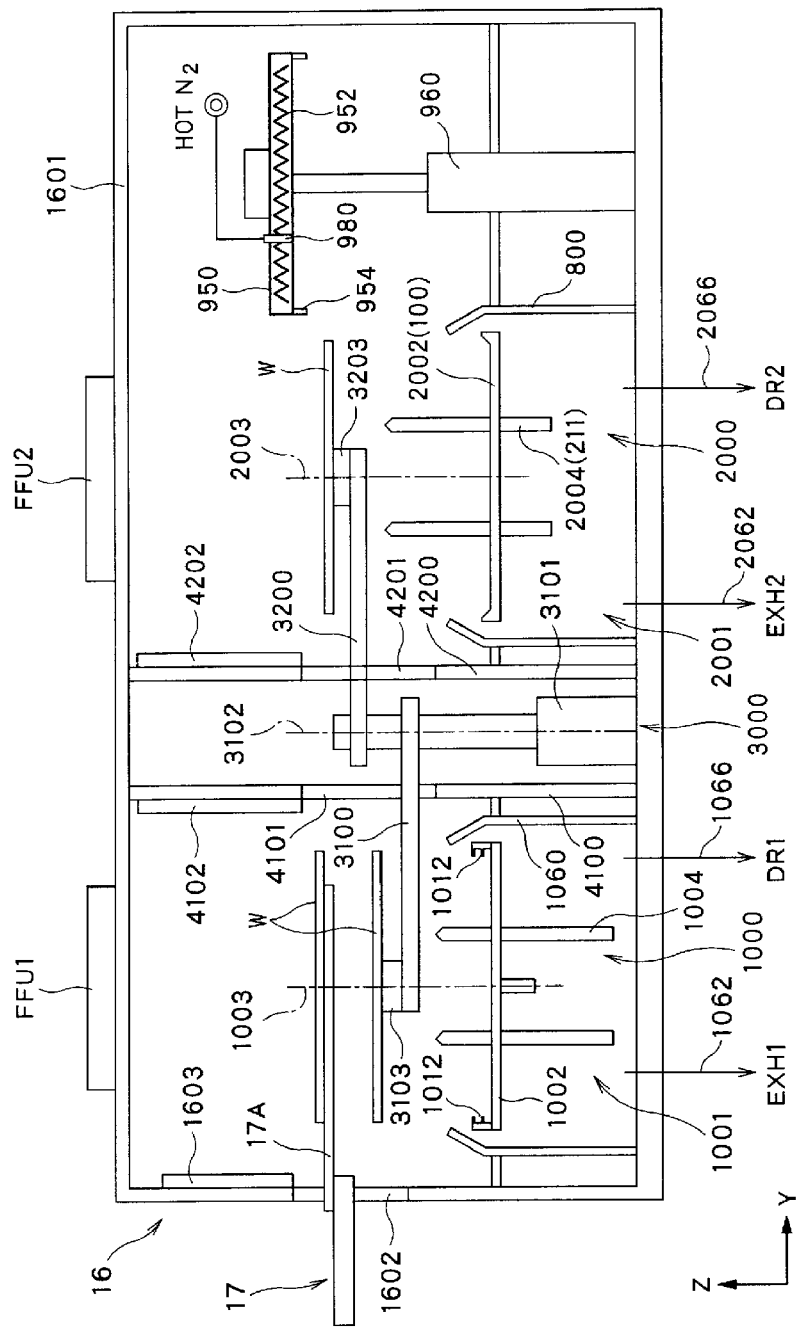
FIG. 3 is a schematic longitudinal cross sectional view illustrating an example configuration of a liquid processing module that can be used in the substrate processing apparatus shown in FIG. 1.
Figure 6:
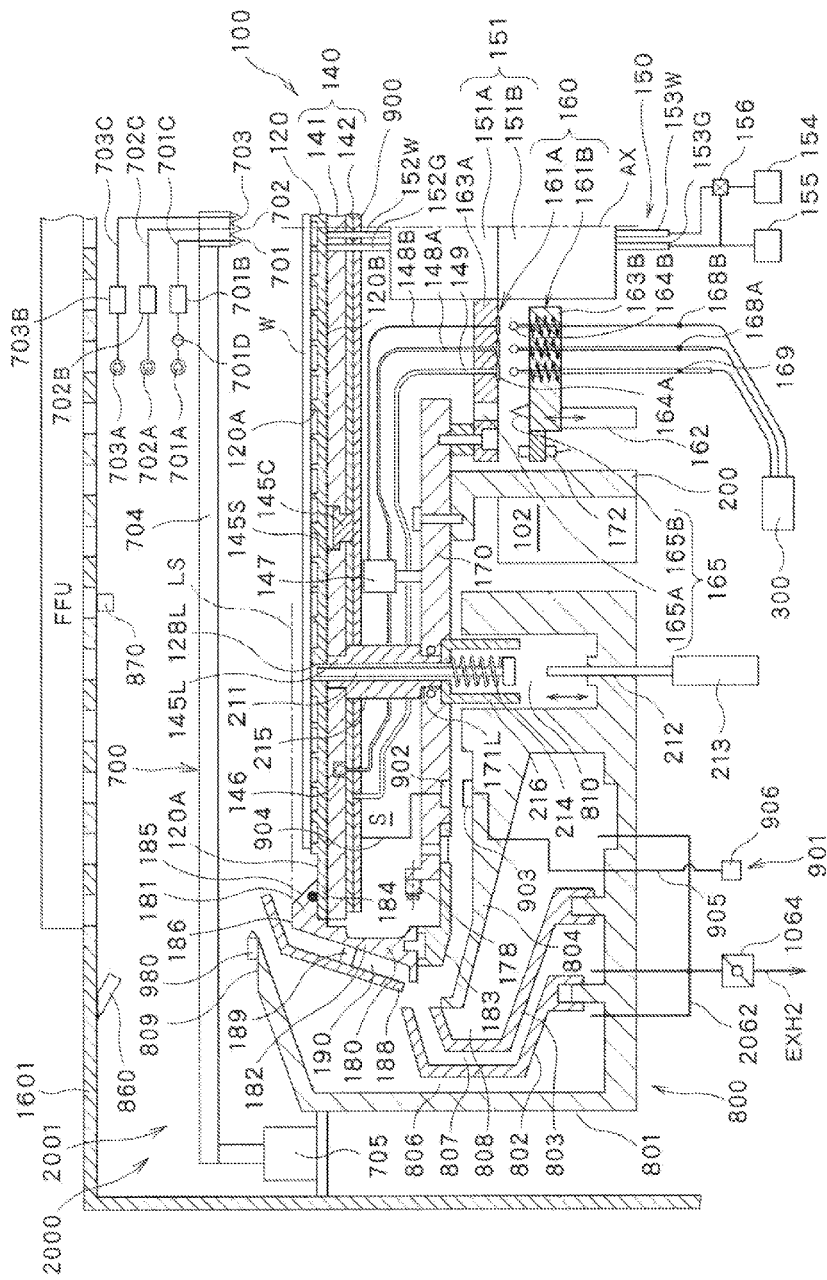
FIG. 6 is a schematic longitudinal cross sectional view illustrating an example configuration of a second liquid processing device of the liquid processing module shown in FIG. 3.

Further, the exhaust passageway 1062 and the drain passageway 1066 are also illustrated schematically in FIG. 3. An exhaust passageway 2062 (illustrated in FIG. 3 and FIG. 6) and a drain passageway 2066 (illustrated only in FIG. 3) identical to the exhaust passageway 1062 and the drain passageway 1066, respectively, are also provided in the second liquid processing device 2000. As illustrated in FIG. 6, the flow rate control device 1064 such as an exhaust damper or a butterfly valve is also provided in the exhaust passageway 2062. The exhaust passageway 2062 and the drain passageway 2066 are also connected to a factory exhaust system EXH2 and a factory drain passageway DR2, respectively.

The exhaust passageway 1062 may be provided to suction a gas directly from the inside of the first liquid processing device 1000 and an external space of the liquid recovery cup 1060 as well as from the liquid recovery cup 1060. Likewise, the exhaust passageway 2062 may be provided to suction a gas directly from the inside of the second liquid processing device 2000 and an external space of a liquid recovery cup 800 (see FIG. 3 and FIG. 6) as well as from the liquid recovery cup 800.

As illustrated in FIG. 3, a ceiling of the housing 1601 is equipped with a first fan filter unit FFU1 serving as a first gas supply at a position corresponding to the first liquid processing device 1000 and a second fan filter unit FFU2 serving as a second gas supply at a position corresponding to the second liquid processing device 2000. These fan filter units FFU1 and FFU2 can supply clean gases (clean air, clean dry air, nitrogen gas or a mixed gas thereof) into the first and second liquid processing devices 1000 and 2000, respectively. Desirably, flow rates of the clean gases supplied from the first fan filter unit FFU1 and the second fan filter unit FFU2, respectively, can be controlled independently.

Desirably, the second fan filter unit FFU2 of the second liquid processing device 2000 may serve to supply a nitrogen gas (or a mixed gas of clean air and nitrogen gas) as a low oxygen-containing gas as well as the clean gas. Thus, the concentration of oxygen in an internal space of the second liquid processing device 2000 (corresponding to an internal space of the housing 1601 in FIG. 6 to be described later) can be reduced.

A pressure (hereinafter, referred to as "pressure P1") inside the first liquid processing device 1000 is determined by a balance between a flow rate of the gas supplied from the fan filter unit FFU1 and a flow rate of the gas exhausted through the exhaust passageway 1062. Likewise, a pressure (hereinafter, referred to as "pressure P2") inside the second liquid processing device 2000 is determined by a balance between a flow rate of the gas supplied from the fan filter unit FFU2 and a flow rate of the gas exhausted through the exhaust passageway 2062. Therefore, in each of the first liquid processing device 1000 and the second liquid processing device 2000, by appropriately regulating at least one of the flow rate of the gas to be supplied and the flow rate of the gas to be exhausted, a relationship between the pressure P1 and the pressure P2 can be controlled as desired.

Herein, when a pressure inside the transfer path 15A is set to PT (typically referring to an atmospheric pressure), the PT desirably may satisfy the condition of PT>P1>P2. Particularly, as described below, when a chemical liquid processing at a high temperature (an electroless plating processing in the present exemplary embodiment) is performed within the second liquid processing device 2000, it is possible to suppress the introduction of the most highly contaminated atmosphere inside the second liquid processing device 2000 into the first liquid processing device 1000 and the transfer path 15A.

Hereinafter, a configuration of an exemplary embodiment of the second rotational liquid processing unit 2001 provided in the second liquid processing device 2000 will be described with reference to FIG. 6. The second rotational liquid processing unit 2001 is configured as a single-wafer type dip liquid processing unit and also configured to perform a plating processing in a state where a plating liquid is accumulated on the wafer W.

As shown in FIG. 6, the second rotational liquid processing unit 2001 is equipped with a rotary table 100 (a second spin chuck), a processing liquid supply 700 configured to supply a processing liquid onto the wafer W and the liquid recovery cup (processing cup) 800 configured to receive the processing liquid scattered from the substrate being rotated. The rotary table 100 is capable of horizontally holding and rotating a circular substrate such as a wafer W. The constituent components of the second rotational liquid processing unit 2001, such as the rotary table 100, the processing liquid supply 700 and the liquid recovery cup 800, are accommodated in a housing 1601. The constituent components inside the liquid recovery cup 800 have an approximately rotationally symmetric shape, and FIG. 6 illustrates only a left half of the second rotational liquid processing unit 2001.

The rotary table 100 is configured as a vacuum attraction type spin chuck (a vacuum chuck). The rotary table 100 includes an attraction plate 120, a hot plate 140, a support plate 170, a periphery cover body 180 and a hollow rotation shaft 200. The attraction plate 120 is configured to horizontally attract the wafer W placed thereon. The hot plate 140 serves as a base plate of the attraction plate 120 and is configured to support and heat the attraction plate 120. The support plate 170 is configured to support the attraction plate 120 and the hot plate 140. The rotation shaft 200 extends downwards from the support plate 170. The rotary table 100 is rotated around a vertically extending rotation axis Ax by an electric driving unit 102 disposed around the rotation shaft 200. Thus, the wafer W held by the rotary table 100 can be rotated around the rotation axis Ax. The electric driving unit 102 (details of which are not illustrated) is configured to transfer a motive power generated by an electric motor to the rotation shaft 200 via a power transmission mechanism (for example, a belt and a pulley) to rotate the rotation shaft 200. Alternatively, the electric driving unit 102 may be configured to rotate the rotation shaft 200 directly by the electric motor.

The attraction plate 120 is a circular plate-shaped member having a slightly larger diameter than the wafer W (or the same diameter as that of the wafer W in some configurations), i.e., circular plate-shaped member having the same or larger area than the wafer W. The attraction plate 120 has a top surface (front surface) 120A configured to attract a bottom surface (not to be processed) of the wafer W and a bottom surface (rear surface) 120B in contact with a top surface of the hot plate 140. The attraction plate 120 may be made of a material having high thermal conductivity such as thermal conductive ceramic, for example, SiC. Desirably, the material of the attraction plate 120 may have a thermal conductivity of 150 W/m·k or more.

The hot plate 140 is a circular plate-shaped member having substantially the same diameter as that of the attraction plate 120. The hot plate 140 has a plate main body 141 and an electric type heater (electric heater) 142 (a heating unit) provided in the plate main body 141. The plate main body 141 is made of a material having high thermal conductivity such as thermal conductive ceramic, for example, SiC. Desirably, the material of the plate main body 141 may have a thermal conductivity of 150 W/m·k or more.

Figure 7:
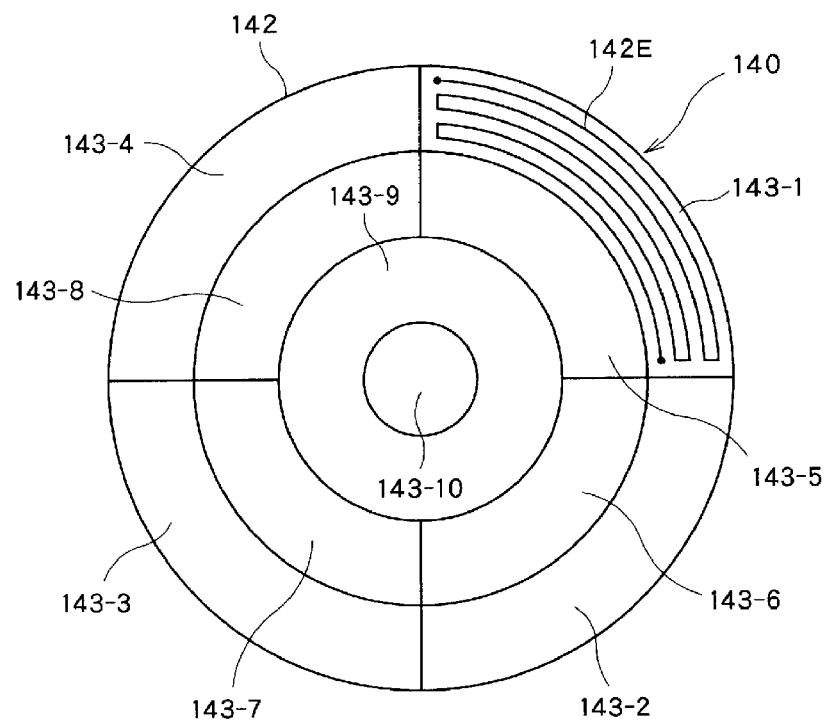
FIG. 7 is a schematic plan view illustrating an example arrangement of a heater of a hot plate provided in the second liquid processing device.

The heater 142 may be configured as a sheet-type heater, e.g., a polyimide heater, provided in a bottom surface (rear surface) of the plate main body 141. Desirably, a plurality of (for example, ten) heating zones 143-1 to 143-10 is set in the hot plate 140, as shown in FIG. 7. The heater 142 is composed of a plurality of heater elements 142E respectively assigned to the heating zones 143-1 to 143-10. Each heater element 142E is made of a conductor extending in a zigzag shape within each of the heating zones 143-1 to 143-10. FIG. 7 illustrates only the heater element 142E within the heating zone 143-1.

An electric power can be fed to the plurality of heater elements 142E independently by a power feeder 300 to be described later. Accordingly, the different heating zones for the wafer W can be heated in different conditions, and, thus, it is possible to control the temperature distribution of the wafer W.

An auxiliary heater 900 having substantially the same planar shape as the heater 142 is also provided at the bottom surface of the heater 142. Like the heater 142, the auxiliary heater 900 may be configured as the sheet-type heater, e.g., the polyimide heater. Desirably, an insulating film made of a polyimide film is interposed between the heater 142 and the auxiliary heater 900, each of which may be configured as the polyimide heater. As can be understood from the following description, the auxiliary heater 900 is provided to heat (keep warmth of) the hot plate 140 in a time period, such as a period of rotation of the rotary table 100, during which the power cannot be supplied to the heater 142.

In the auxiliary heater 900 like the heater 142, a plurality of heating zones may be set and controlled individually. A single heating zone may be set in the heater 142, and the entire region of the heater 142 may be controlled to generate heat uniformly.

Figure 8:
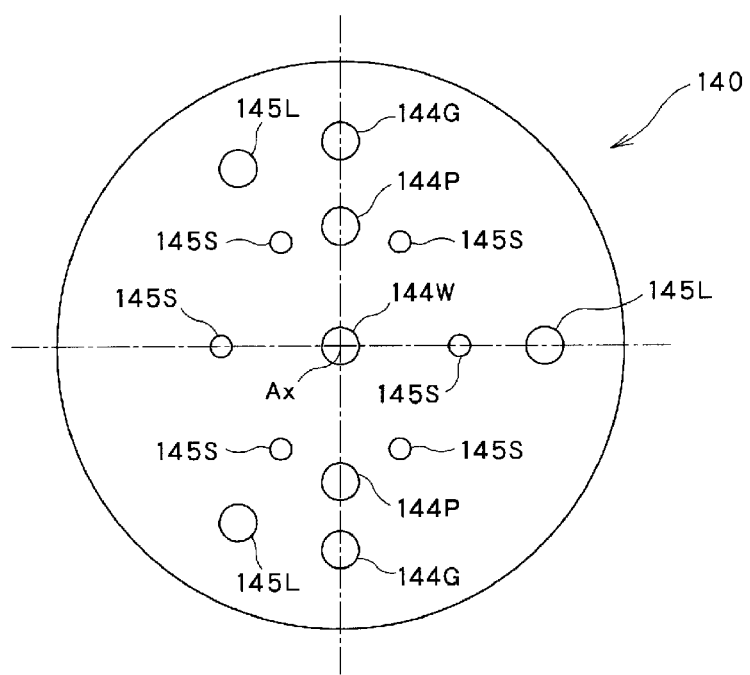
FIG. 8 is a schematic plan view illustrating a top surface of the hot plate.

As shown in FIG. 8, a top surface (front surface) of the plate main body 141 has one or more (two in the illustrated exemplary embodiment) plate suction holes 144P, one or more (one at a central portion in the illustrated exemplary embodiment) substrate suction hole 144W and one or more (two at an outer portion in the illustrated exemplary embodiment) purge gas supply holes 144G. The plate suction holes 144P are used to transfer a suction force for attracting the attraction plate 120 to the hot plate 140. The substrate suction hole 144W is used to transfer a suction force for attracting the wafer W to the attraction plate 120.

Further, the plate main body 141 is equipped with a plurality of (three in the illustrated exemplary embodiment) lift pin holes 145L through which lift pins 211 to be described later pass and a plurality of (six in the illustrated exemplary embodiment) service holes 145S for accessing assembly screws of the rotary table 100. During a normal operation, the service holes 145S are closed with caps 145C as shown in FIG. 6.

The above-described heater elements 142E are arranged to avoid the plate suction holes 144P, the substrate suction hole 144W, the purge gas supply holes 144G, the lift pin holes 145L and the service holes 145S. Further, by achieving the connection to the rotation shaft 200 through an electromagnet, the service holes may be omitted.

Figure 9:
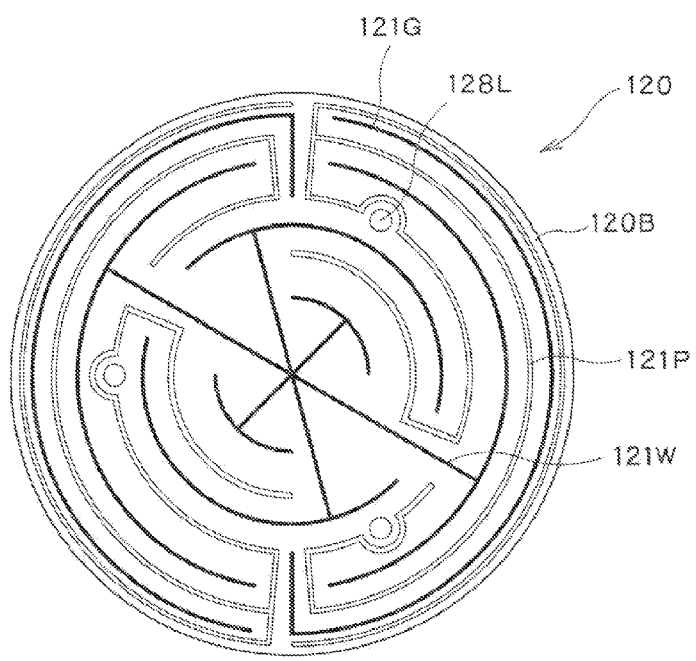
FIG. 9 is a schematic plan view illustrating an example configuration of a bottom surface of an attraction plate provided in the second liquid processing device.

As shown in FIG. 9, the bottom surface 120B of the attraction plate 120 has a plate bottom surface suction path groove 121P, a substrate bottom surface suction path groove 121W and a bottom surface purge path groove 121G. When the attraction plate 120 is placed in an appropriate positional relationship on the hot plate 140, at least a part of the plate bottom surface suction path groove 121P communicates with the plate suction holes 144P. Likewise, at least a part of the substrate bottom surface suction path groove 121W communicates with the substrate suction hole 144W, and at least a part of the bottom surface purge path groove 121G communicates with the purge gas supply holes 144G. The plate bottom surface suction path groove 121P, the substrate bottom surface suction path groove 121W_and the bottom surface purge path groove 121G are arranged separately from each other (do not communicate with each other).

Figure 13:
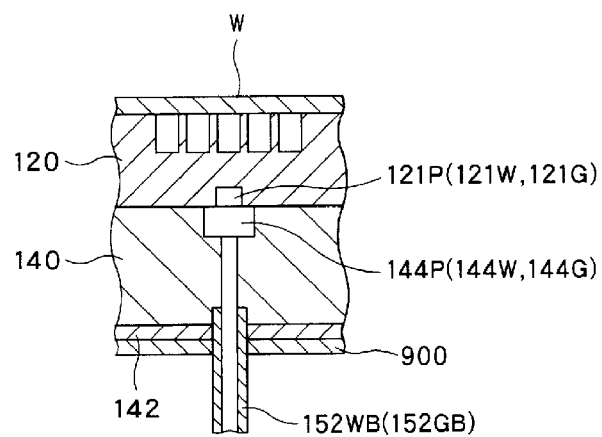
FIG. 13 is a schematic cross sectional view illustrating the attraction plate taken along a different cross section from FIG. 12.

FIG. 13 schematically illustrates a state where the plate suction holes 144P (or 144W or 144G) of the hot plate 140 and the path groove 121P (or 121W or 121G) of the attraction plate 120 are overlapped to communicate with each other.

Figure 10:
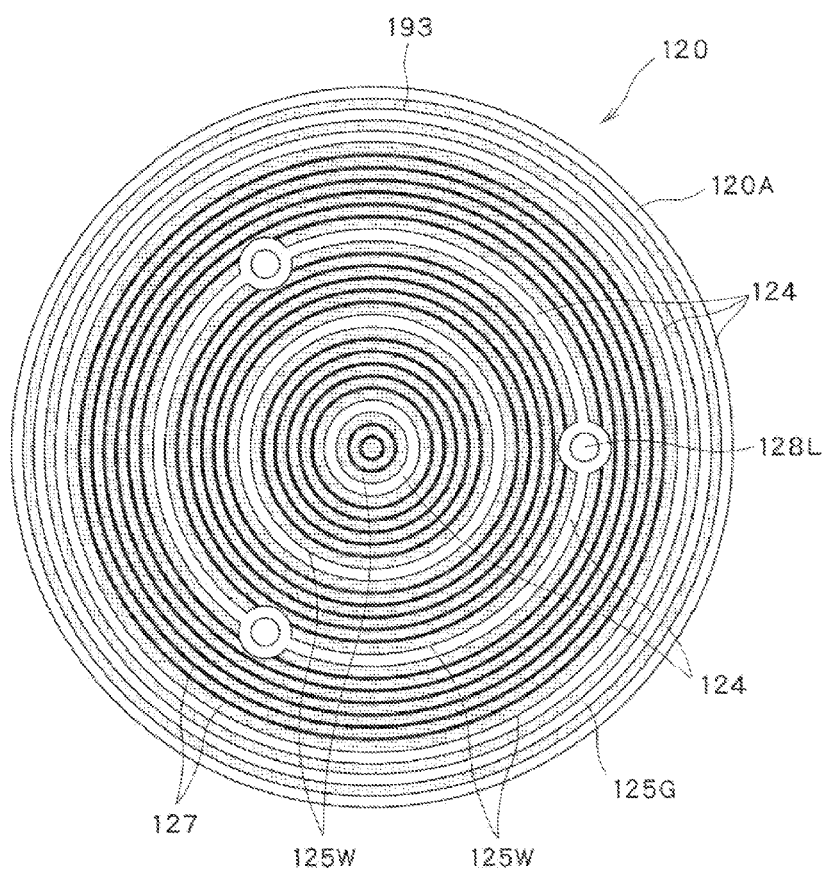
FIG. 10 is a schematic plan view illustrating an example configuration of a top surface of the attraction plate.
Figure 12:
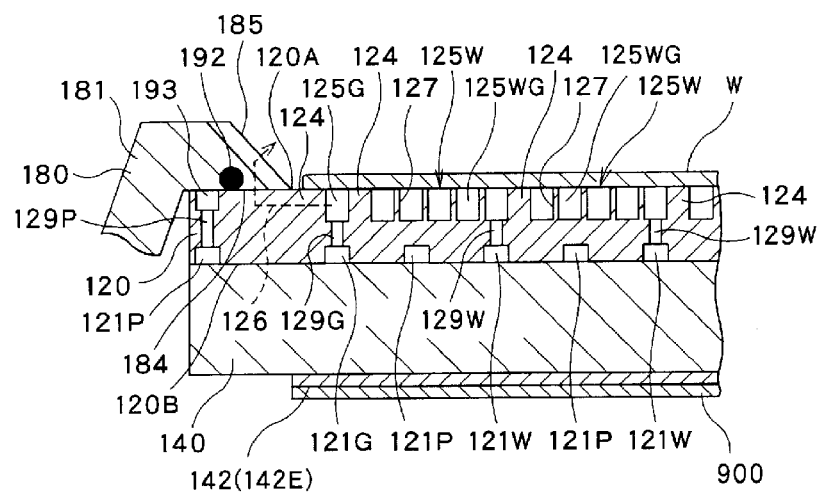
FIG. 12 is a schematic cross sectional view of the attraction plate.

As shown in FIG. 10 and FIG. 12, a plurality of (five in the illustrated exemplary embodiment) thick annular partition walls 124 is formed on the top surface 120A of the attraction plate 120. The thick partition walls 124 define, on the top surface 120A, a plurality of recess regions 125W and 125G (four circular ring-shaped regions in an outer portion and a circular region in an innermost portion) which is separated from each other.

A plurality of through holes 129W (see FIG. 12) penetrating the attraction plate 120 in a thickness direction thereof is formed at a plurality of locations on the substrate bottom surface suction path groove 121W, and each through hole allows the substrate bottom surface suction path groove 121W to communicate with the corresponding one of the plurality of (four in the illustrated exemplary embodiment) recess regions 125W.

Further, through holes 129G (see FIG. 12) penetrating the attraction plate 120 in the thickness direction are formed at a plurality of locations on the bottom surface purge path groove 121G, and each through hole allows the bottom surface purge path groove 121G to communicate with the outermost recess region 125G. The outermost recess region 125G serves as a single top surface purge path groove having a circular ring shape.

In each of the four recess regions 125W in the inner portion, a plurality of thin annular separation walls 127 is provided concentrically. The narrow separation walls 127 form at least one top surface suction path groove 125WG extending in a zigzag shape within each recess region 125W. That is, the narrow separation walls 127 serve to uniformly distribute the suction force within each recess region 125W.

As shown in FIG. 6, a suction/purge unit 150 is provided in the vicinity of the rotation axis Ax. The suction/purge unit 150 is equipped with a rotary joint 151 provided within the hollow rotation shaft 200. An upper piece 151A of the rotary joint 151 is connected to a suction line 152W communicating with the plate suction holes 144P and the substrate suction hole 144W of the hot plate 140 and a purge gas supply line 152G communicating with the purge gas supply holes 144G.

A lower piece 151B of the rotary joint 151 is connected to a suction line 153W communicating with the suction line 152W and a purge gas supply line 153G communicating with the purge gas supply line 151G. The rotary joint 151 is configured such that the upper piece 151A and the lower piece 151B can be rotated relative to each other while the suction lines 152W and 153W are kept in communication each other and the purge gas supply lines 152G and 153G are kept in communication each other. The rotary joint 151 capable of allowing a fluid to flow between the two relatively rotatable pieces without being leaked has been well known in the technical field of fluid line.

The suction line 153W is connected to a suction device 154 such as a vacuum pump. The purge gas supply line 153G is connected to a purge gas supply device 155. The suction line 153W is also connected to the purge gas supply device 155. Further, a switch device (for example, three-way valve) 156 configured to switch a connection destination of the suction line 153W between the suction device 154 and the purge gas supply device 155 is provided.

A plurality of temperature sensors 146 configured to detect the temperature of the plate main body 141 of the hot plate 140 is embedded in the hot plate 140. For example, the temperature sensors 146 may be provided for the ten heating zones 143-1 to 143-10 in one-to-one correspondence. Further, at least one thermo switch 147 configured to detect overheating of the heater 142 is provided near the heater 142 of the hot plate 140.

Besides the temperature sensors 146 and the thermo switch 147, control signal lines 148A and 148B for transmitting detection signals of the temperature sensors 146 and the thermo switch 147 and a power feed line 149 for power feed to each heater element 142E of the heater 142 are provided in a space S between the hot plate 140 and the support plate 170.

As shown in FIG. 6, a switch mechanism 160 is provided near the rotary joint 151. The switch mechanism 160 is equipped with a first electrode unit 161A fixed with respect to the direction of the rotation axis Ax, a second electrode unit 161B configured to be movable in the direction of the rotation axis Ax and an electrode moving mechanism 162 (elevating mechanism) configured to move (elevate) the second electrode unit 161B in the direction of the rotation axis Ax.

Figure 11:
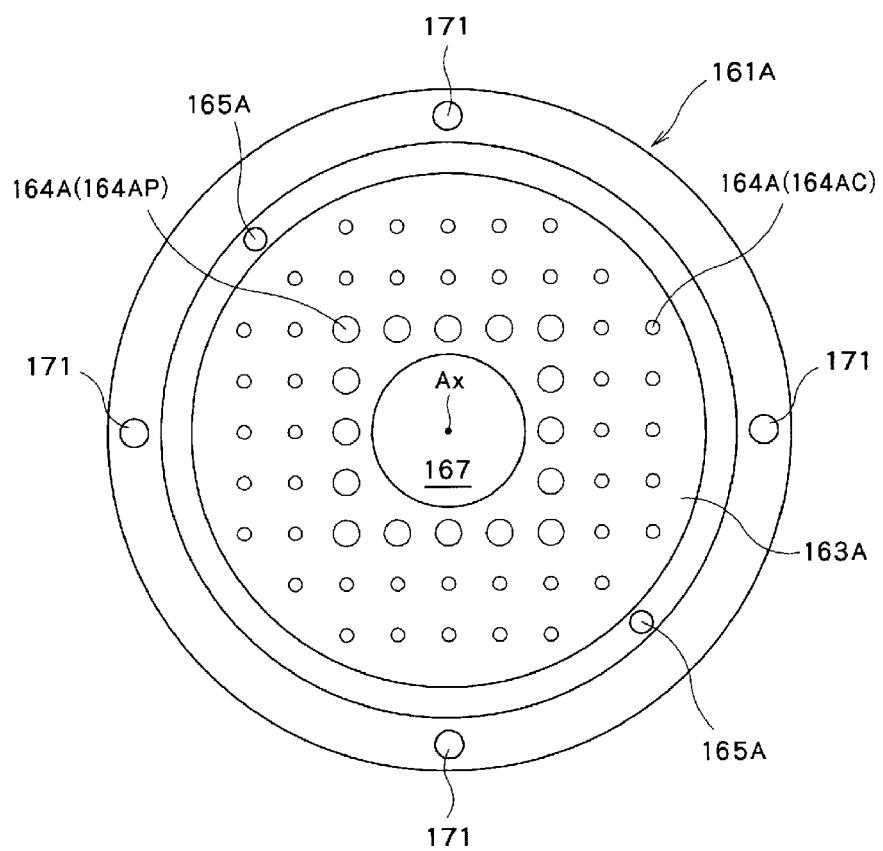
FIG. 11 is a schematic plan view illustrating an example configuration of a first electrode unit provided in the second liquid processing device.

As shown in FIG. 11, the first electrode unit 161A is equipped with a first electrode supporting body 163A and a plurality of first electrodes 164A supported by the first electrode supporting body 163A. The plurality of first electrodes 164A includes first electrodes 164AC (indicated by small "O" in FIG. 11) for control signal communication connected to the control signal lines 148A and 148B and first electrodes 164AP (indicated by large "O" in FIG. 11) for heater power feed connected to the power feed line 149. Desirably, the first electrode 164AP in which a high current (heater current) flows is set to have a larger area than the first electrode 164AC in which a low current (control signal current) flows.

The first electrode supporting body 163A is a member having a circular plate shape overall. A circular hole 167 into which the upper piece 151A of the rotary joint 151 is inserted is formed at a central portion of the first electrode supporting body 163A. The upper piece 151A of the rotary joint 151 may be fixed to the first electrode supporting body 163A. A peripheral portion of the first electrode supporting body 163A may be screw-coupled to the support plate 170 by using screw holes 171.

As schematically shown in FIG. 6, the second electrode unit 161B is equipped with a second electrode supporting body 163B and a plurality of second electrodes 164B supported by the second electrode supporting body 163B. The second electrode supporting body 163B is a member having a circular plate shape overall and having substantially the same diameter as that of the first electrode supporting body 163A shown in FIG. 11. A circular hole through which the lower piece 151B of the rotary joint 151 can pass is formed at a central portion of the second electrode supporting body 163B.

The second electrodes 164B configured to be contacted or separated with respect to the first electrodes 164A by being moved up and down with respect to the first electrodes 164A have the same layout as that of the first electrodes 164A. Hereinafter, the second electrodes 164B (power feeding electrodes) configured to be brought into contact with the first electrodes 164AP (power receiving electrodes) for heater power feed will also be referred to as "second electrodes 164BP". Further, the second electrodes 164B configured to be brought into contact with the first electrodes 164AC for control signal communication will also be referred to as "second electrodes 164BC". The second electrodes 164BP are connected to a power output port of the power feed device (power feeder) 300. The second electrodes 164BC are connected to a control input/output port of the power feeder 300.

At least a part of conductive paths 168A, 168B and 169 (see FIG. 6) connecting the second electrodes 164B to the power output port and the control input/output port of the power feeder 300 is made of a flexible wire. Due to the flexible wire, the entire second electrode unit 161B can be rotated around the rotation axis Ax in a forward rotation direction and in a backward rotation direction from a neutral position at a predetermined angle while maintaining the electric conduction between the second electrodes 164B and the power feeder 300. The predetermined angle may be, for example, 180 degrees, but is not limited thereto. This means that the rotary table 100 can be rotated by about ±180 degrees while maintaining the contact between the first electrodes 164A and the second electrodes 164B.

One of the first electrode 164A and the second electrode 164B in each pair may be configured as a pogo pin. In FIG. 6, all the second electrodes 164B are configured as pogo pins. Here, the term "pogo pin" is widely used to imply an extensible/contractible rod-shaped electrode having a spring embedded therein. Instead of the pogo pin, a socket, a magnet electrode, an induction electrode, or the like may be used as the electrode.

Desirably, there may be provided a lock mechanism 165 configured to lock the first electrode supporting body 163A and the second electrode supporting body 163B not to be rotated relative to each other when the first electrode 164A and the second electrode 164B are in appropriate contact with each other. For example, as shown in FIG. 6, the lock mechanism 165 may be composed of a hole 165A formed at the first electrode supporting body 163A and a pin 165B provided at the second electrode supporting body and configured to be inserted and fitted into the hole.

Desirably, there may also be provided a device 172 (schematically shown in FIG. 6) configured to detect an appropriate contact between the first electrode 164A and the second electrode 164B. This device 172 may be an angular position sensor (not shown) configured to detect a state where the first electrode supporting body 163A and the second electrode supporting body 163B have an appropriate angular positional relationship. Alternatively, this device 172 may be a distance sensor (not shown) configured to detect a state where the first electrode supporting body 163A and the second electrode supporting body 163B have an appropriate distance in the direction of the rotation axis Ax. Still alternatively, this device 172 may be a contact type sensor (not shown) configured to detect a state where the pin 165B is appropriately inserted and fitted into the hole 165A of the lock mechanism 165.

The electrode moving mechanism 162 schematically shown in FIG. 6 may be equipped with, although not shown, a push rod configured to push the second electrode supporting body 163B upwards and an elevating mechanism (an air cylinder, a ball screw, or the like) configured to move the push rod up and down (first configuration example). For example, when using this configuration, a permanent magnet may be provided at the first electrode supporting body 163A and an electromagnet may be provided at the second electrode supporting body 163B. With this configuration, when necessary, the first electrode unit 161A and the second electrode unit 161B can be coupled not to be vertically moved relative to each other, and the first electrode unit 161A and the second electrode unit 161B can be separated from each other.

When adopting the first configuration example, if the first electrode unit 161A and the second electrode unit 161B are contacted and separated at the same angular position of the rotary table 100, the second electrode unit 161B does not need to be supported to be rotatable around the rotation axis Ax. That is, only a member (for example, the above-described push rod, or another supporting table) configured to support the second electrode unit 161B when the first electrode unit 161A and the second electrode unit 161B are separated from each other may be needed.

Instead of the above-described first configuration example, a second configuration example may be adopted. Although not shown in detail in the drawings, the second configuration example of the electrode moving mechanism 162 is equipped with a first ring-shaped member having a circular ring shape centered on the rotation axis Ax, a second ring-shaped member configured to support the first ring-shaped member, a bearing provided between the first and second ring-shaped members and configured to enable the first and second ring-shaped members to be rotated relative to each other, and an elevating mechanism (an air cylinder, a ball screw, or the like) configured to move the second ring-shaped member up and down.

When adopting any one of the first configuration example and the second configuration example, it is possible to rotate the first electrode unit 161A and the second electrode unit 161B together within a limited angle range while keeping the first electrode 164A and the second electrode 164B in the appropriate contact with each other.

The electric driving unit 102 of the rotary table 100 has a positioning function to stop the rotary table 100 at a certain rotational angular position. This positioning function can be implemented by rotating a motor of the electric driving unit 102 based on a detection value of a rotary encoder provided in the rotary table 100 (or a member rotated by the rotary table 100). By moving the second electrode unit 161B upwards with the electrode moving mechanism 162 in a state where the rotary table 100 is stopped at a predetermined rotational angular position, corresponding electrodes of the first electrode unit 161A and the second electrode unit 161B can be brought into appropriate contact with each other. Desirably, the second electrode unit 161B may be separated from the first electrode unit 161A in the state where the rotary table 100 is stopped at the predetermined rotational angular position.

As described above, a plurality of electronic components (heater, wiring, sensor) are disposed in the space S between the attraction plate 120 and the support plate 170 and at positions facing the space S. The periphery cover body 180 suppresses a processing liquid supplied to the wafer W, particularly, a corrosive chemical liquid from being introduced into the space S and thus protects the electronic components. A purge gas (N₂ gas) may be supplied into the space S through a line (not shown) branched from the purge gas supply line 152G. By supplying the purge gas into the space S in this way, the introduction of a corrosive gas originated from the chemical liquid into the space S from the outside can be suppressed, and, thus, the space S can be maintained in a non-corrosive atmosphere.

Hereinafter, a power feed device of the auxiliary heater 900 will be described. The power feed device has a contact type power transmission mechanism. The power transmission mechanism is configured to feed the power to the auxiliary heater 900 even when the rotary table 100 is continuously rotated in one direction (at this time, the power cannot be fed to the heater 142 via the switch mechanism 160). The power transmission mechanism is configured to be arranged coaxially with the rotary joint 151 (see FIG. 6) and, desirably, mounted on the rotary joint 151 or integrally formed with the rotary joint 151.

Figure 14A:
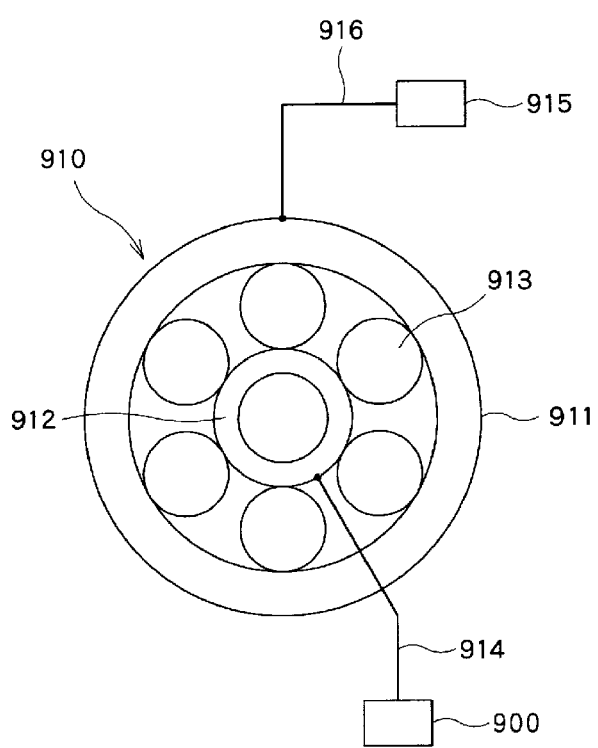
FIG. 14A is a schematic diagram for describing a principle of a first configuration example of a power transmission mechanism for power feed to an auxiliary heater provided in the second liquid processing device.

A power transmission mechanism 910 according to the first configuration example will be described with reference to an operational principle diagram of FIG. 14A and an axial cross sectional view of FIG. 14B. As shown in FIG. 14A, the power transmission mechanism 910 has a configuration similar to that of a rolling bearing (a ball or a roller bearing) and is equipped with an outer race 911, an inner race 912 and a plurality of rolling bodies (for example, balls) 913. The outer race 911, the inner race 912 and the rolling bodies 913 are made of a conductive material. Desirably, an appropriate pre-load is applied between the constituent components 911, 912 and 913 of the power transmission mechanism 910. Accordingly, it is possible to secure more stable conduction between the outer race 911 and the inner race 912 via the rolling bodies 913.

Figure 14B:
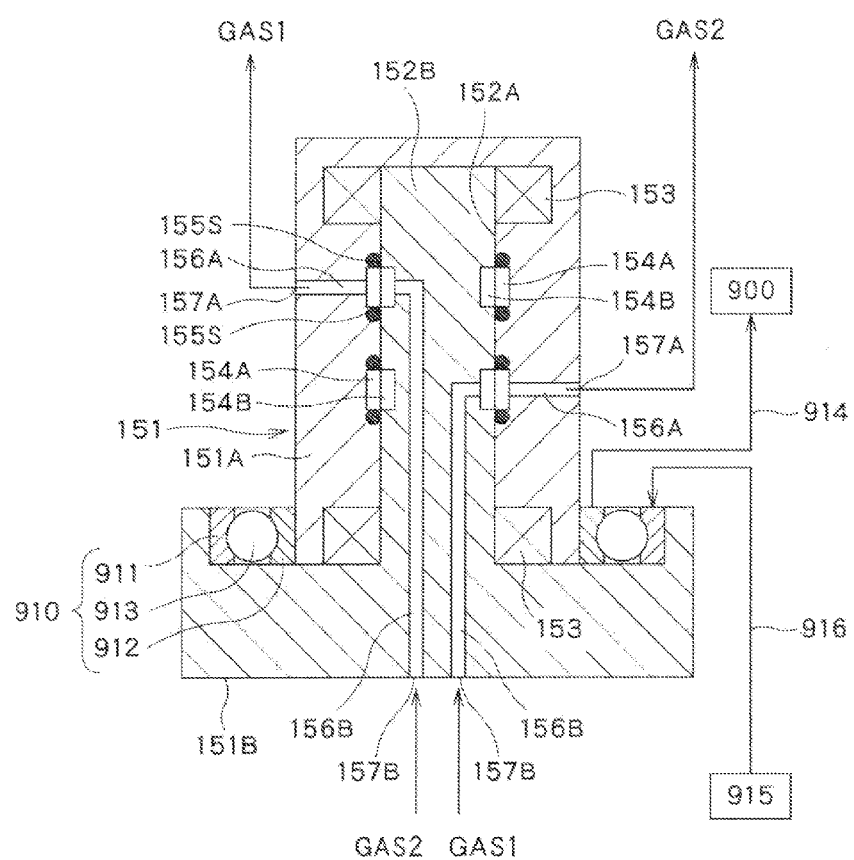
FIG. 14B is an axial cross sectional view illustrating the first configuration example of the power transmission mechanism for power feed to the auxiliary heater provided in the second liquid processing device.

A specific example of the rotary joint 151 equipped with the power transmission mechanism 910 according to the above-described operational principle is shown in FIG. 14B. The rotary joint 151 includes the lower piece 151B fixed to a frame provided within the housing 1601 (see FIG. 6) or fixed to a bracket fixed thereto (both of which are not illustrated), and the upper piece 151A fixed to the rotary table 100 or a member (not shown) configured to be rotated along with the rotary table 100.

Although the configuration of the rotary joint 151 shown in FIG. 14B is well known in the art, it will be briefly explained herein. That is, a columnar central protrusion 152B of the lower piece 151B is inserted in a cylindrical central hole 152A of the upper piece 151A. The central protrusion 152B is supported at the upper piece 151A via a pair of bearings 153. Circumferential grooves 154A are formed in an inner peripheral surface of the central hole 152A, and the number of the circumferential grooves 154A depends on the number of the kinds of gases used (two GAS1 and GAS2 in FIG. 14B, but is not limited thereto). Seal rings 155S configured to suppress a leakage of a gas are provided at both sides of each circumferential groove 154A. Gas passageways 156A respectively communicating with the circumferential grooves 154A are formed within the upper piece 151A. An end portion of each gas passageway 156A is configured as a gas outlet port 157A. A plurality of circumferential grooves 154B is formed in an outer peripheral surface of the central protrusion 152B at axial positions respectively corresponding to the plurality of circumferential grooves 154A. Gas passageways 156B respectively communicating with the plurality of circumferential grooves 154B are formed within the lower piece 151B. An end portion of each gas passageway 156B is configured as a gas inlet port 157B.

According to the configuration shown in FIG. 14B, even when the upper piece 151A and the lower piece 151B are rotated, a gas can be flowed between the gas inlet port 157B and the gas outlet port 157A without a substantial leakage of a gas. A suction force can also be transferred between the gas inlet port 157B and the gas outlet port 157A.

The power transmission mechanism 910 is provided between the upper piece 151A and the lower piece 151B of the rotary joint 151. In the example shown in FIG. 14B, the outer race 911 is inserted and fitted (for example, press-fitted) into a cylindrical recess portion of the lower piece 151B, and a columnar outer peripheral surface of the upper piece 151A is inserted and fitted (for example, press-fitted) into the inner race 912. Electrical insulation has been performed appropriately between the outer race 911 and the lower piece 151B and between the upper piece 151A and the inner race 912. The outer race 911 is electrically connected to a power supply (or a power feed controller) 915 via a wire 916 and the inner race 912 is electrically connected to the auxiliary heater 900 via a wire 914. Further, in the example shown in FIG. 14B, the inner race 912 is a rotary part configured to be rotated as one body with the rotary table 100 and the outer race 911 is a fixed part that is not rotated.

Further, in the configuration shown in FIG. 14B, the power transmission mechanism 910 is equipped with rolling bearings at multiple levels in the axial direction, and, thus, it is possible to feed the power through multiple channels. In this case, a plurality of heating zones may be provided in the auxiliary heater 900, and, thus, it is possible to feed the power to each heating zone independently.

Figure 14C:
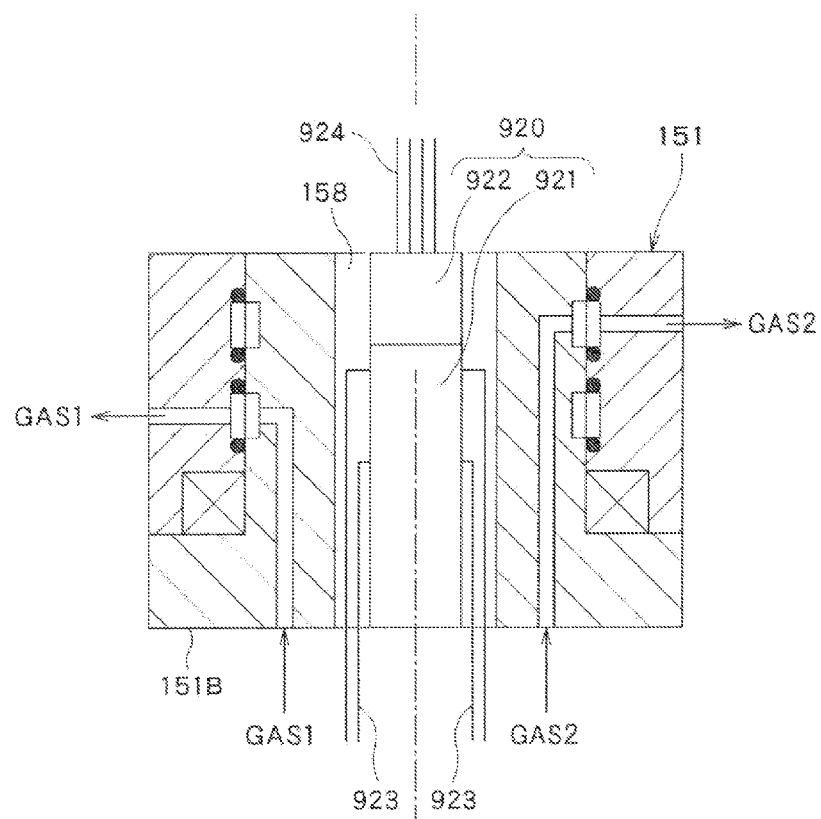
FIG. 14C is an axial cross sectional view illustrating a second configuration example of the power transmission mechanism for power feed to the auxiliary heater provided in the second liquid processing device.

A power transmission mechanism 920 according to a second configuration example will be described with reference to FIG. 14C. The power transmission mechanism 920 shown FIG. 14C is configured as a well-known slip ring and configured to feed a power through multiple channels. The slip ring is composed of a fixed part 921 and a rotary part 922. The fixed part 921 is fixed to the frame provided within the housing 1601 or fixed to the bracket fixed thereto (both of which are not illustrated). The rotary part 922 is fixed to the rotary table 100 or the member (not shown) configured to be rotated along with the rotary table 100. On a side peripheral surface of the fixed part 921, a plurality of ports connected to a plurality of wires 923, which are electrically connected to a power supply or a power feed controller (not shown), is provided. A plurality of wires 924 respectively communicating with the plurality of ports extends from an end surface of the rotary part 922 in the axial direction so as to be electrically connected to the auxiliary heater 900 (see FIG. 6).

In the configuration example of FIG. 14C, the lower piece 151B of the rotary joint 151 is configured as a hollow member having a through hole 158 at a center thereof. The power transmission mechanism 920 configured as the slip ring is provided within the through hole 158. As in the configuration example of FIG. 14B, the lower piece 151B of the rotary joint 151 is fixed to the frame provided within the housing 1601 (see FIG. 6) or fixed to the bracket fixed thereto (both of which are not illustrated). Further, the upper piece 151A of the rotary joint 151 is fixed to the rotary table 100 or the member (not shown) configured to be rotated along with the rotary table 100.

The power feed device may be configured as a wireless (non-contact type) power transmission mechanism of magnetic resonance type or an electromagnetic induction type using magnetic field coupling (this power transmission mechanism itself is well-known in the art). In this case, the wireless power transmission mechanism is composed of a power transmission coil 903 and a power reception coil 902 facing each other with a gap therebetween and extending in the circumferential direction, as schematically illustrated in FIG. 6. A ferrite sheet (not shown) for collecting magnetic flux and suppressing leakage of magnetic field is provided around the power transmission coil 903 and the power reception coil 902. The power transmission coil 903 may be provided at a non-rotary member such as a fixed outer cup element 801, and the power reception coil 902 may be provided at a rotary member such as the support plate 170. The power reception coil 902 is electrically connected to the auxiliary heater 900 through a wire 904. The power transmission coil 903 is electrically connected to a power supply (or power feed controller) 906 through a wire 905.

Even when the non-contact type power transmission mechanisms 902 and 903 schematically illustrated in FIG. 6 are used, for example, by providing the power transmission coil 903 and the power reception coil 902 in a plurality of sets, it is possible to feed the power through multiple channels.

Further, a distributor (not shown) configured to distribute the power transmitted through the power transmission mechanism into multiple channels and a control module (not shown) configured to control the power feed to each heating zone may be provided at an appropriate portion within the space S between the hot plate 140 and the support plate 170. Accordingly, even if the power transmission mechanism is designed to correspond to a single channel, a plurality of heating zones is provided in the auxiliary heater 900, and, thus, it is possible to feed the power to each heating zone independently.

A power feed device configured to feed the power to the auxiliary heater 900 is not limited to the above-described examples. The power feed device may include a power supply device using any one well-known power transmission mechanism having the power transmitting part (fixed part) and the power receiving part (rotary part) configured to be rotated relative to each other while transmitting the power at a desired level.

If the power transmission mechanism is configured to transmit the power through multiple channels, one or more channels may be used to transmit the control signal or the detection signal.

Moreover, the power transmission mechanism shown in FIG. 6 and FIG. 14A to FIG. 14C may perform all or a part of a function of feeding the power to the main heater 142 via the switch mechanism 160 as described above with reference to FIG. 6 and FIG. 11 and a function of transmitting the control/detection signals. In this case, the switch mechanism 160 may be completely omitted, or a part of the components of the switch mechanism 160 may be omitted.

As shown in FIG. 6, the periphery cover body 180 has an upper portion 181, a side peripheral portion 182 and a lower portion 183. The upper portion 181 is protruded above the attraction plate 120 and connected to the attraction plate 120. The lower portion 183 of the periphery cover body 180 is coupled to the support plate 170.

An inner periphery of the upper portion 181 of the periphery cover body 180 is located at an inner side in a radial direction than an outer periphery of the attraction plate 120. The upper portion 181 has a circular ring-shaped bottom surface 184 in contact with the top surface of the attraction plate 120, an inclined circular ring-shaped inner peripheral surface 185 starting from an inner periphery of the bottom surface 184, and a circular ring-shaped outer peripheral surface 186 extending outwards substantially horizontally in the radial direction from an outer periphery of the inner peripheral surface 185. The inner peripheral surface 185 is inclined to be lowered as it approaches the central portion of the attraction plate 120.

Desirably, a seal is provided between the top surface 120A of the attraction plate 120 and the bottom surface 184 of the upper portion 181 of the periphery cover body 180 to suppress introduction of the liquid, as shown in FIG. 12. The seal may be an O-ring 192 disposed between the top surface 120A and the bottom surface 184.

As shown in FIG. 9, a part of the plate bottom surface suction path groove 121P extends in the circumferential direction at an outermost portion of the attraction plate 120. Further, as shown in FIG. 10, a groove 193 extends continuously in the circumferential direction at an outermost portion of the top surface 120A of the attraction plate 120. As shown in FIG. 12, the plate bottom surface suction path groove 121P at the outermost portion and the groove 193 communicate with each other via a plurality of through holes 129P which is formed through the attraction plate 120 in the thickness direction and arranged at a regular distance in the circumferential direction. The bottom surface 184 of the upper portion 181 of the periphery cover body 180 is placed on the groove 193. Accordingly, the bottom surface 184 of the upper portion 181 of the periphery cover body 180 is attracted to the top surface 120A of the attraction plate 120 by a negative pressure acting on the plate bottom surface suction path groove 121P. Since the O-ring 192 is deformed through this attraction, the secure sealing can be achieved.

As shown in FIG. 6 and FIG. 12, the height of the outer peripheral surface 186, i.e., a top portion of the periphery cover body 180, is higher than the height of the top surface of the wafer W held by the attraction plate 120. Accordingly, if the processing liquid is supplied onto the top surface of the wafer W in the state that the wafer W is held by the attraction plate 120, a liquid accumulation (puddle), in which the wafer W can be immersed so that the top surface of the wafer W is located under a liquid surface LS, can be formed. That is, the upper portion 181 of the periphery cover body 180 forms a bank surrounding the wafer W held by the attraction plate 120. A recess portion in which the processing liquid can be stored is defined by this bank and the attraction plate 120.

The inclination of the inner peripheral surface 185 of the upper portion 181 of the periphery cover body 180 facilitates outward scattering of the processing liquid within the above-described recess portion when the rotary table 100 is rotated at a high speed. That is, this inclination suppresses the liquid from staying on the inner peripheral surface of the upper portion 181 of the periphery cover body 180 when the rotary table 100 is rotated at a high speed.

A rotary cup 188 (rotary liquid recovery member) configured to be rotated along with the periphery cover body 180 is provided outside the periphery cover body 180 in the radial direction. The rotary cup 188 is connected to a constituent component of the rotary table 100, i.e., the periphery cover body 180 in the illustrated exemplary embodiment, via a plurality of connecting members 189 arranged at a regular distance in the circumferential direction. An upper end of the rotary cup 188 is located at a height where the processing liquid scattered from the wafer W can be received. A passageway 190 through which the processing liquid scattered from the wafer W flows down is formed between an outer peripheral surface of the side peripheral portion 182 of the periphery cover body 180 and an inner peripheral surface of the rotary cup 188.

The liquid recovery cup 800 surrounds the rotary table 100 and is configured to collect the processing liquid scattered from the wafer W. In the illustrated exemplary embodiment, the liquid recovery cup 800 is equipped with a stationary outer cup component 801, a first movable cup component 802, a second movable cup component 803 configured to be movable up and down and a stationary inner cup component 804. Each of a first discharge passageway 806, a second discharge passageway 807 and a third discharge passageway 808 is formed between two adjacent cup components (between 801 and 802, between 802 and 803 and between 803 and 804). By changing the positions of the first and second movable cup components 802 and 803, the processing liquid discharged from the passageway 190 between the periphery cover body 180 and the rotary cup 188 can be guided into any selected one of the three discharge passageways 806 to 808. The first discharge passageway 806, the second discharge passageway 807 and the third discharge passageway 808 are respectively connected to an acidic liquid drain passageway, an alkaline liquid drain passageway and an organic liquid drain passageway (all of which are not illustrated) which are provided in a semiconductor manufacturing factory. A non-illustrated gas-liquid separation structure is provided within each of the first discharge passageway 806, the second discharge passageway 807 and the third discharge passageway 808. The first discharge passageway 806, the second discharge passageway 807 and the third discharge passageway 808 are connected to and suctioned by a factory exhaust system via an exhaust device (not shown) such as an ejector. This liquid recovery cup 800 has been well known in the art by Japanese Patent Laid-open Publication No. 2012-129462, Japanese Patent Laid-open Publication No. 2014-123713, Japanese laid-open publication pertinent to the present patent application filed by the present applicant, and so forth. For details of this liquid recovery cup 800, these documents may be referred to. The liquid recovery cup 1060 of the first liquid processing device 1000 may also be configured as described above.

Three lift pin holes 128L and three lift pin hoes 171L are formed at the attraction plate 120 and the support plate 170, respectively, so as to be aligned with the three lift pin holes 145L of the hot plate 140 in the direction of the rotation axis Ax.

As shown in FIG. 6, the rotary table 100 is equipped with a plurality of (three in the illustrated exemplary embodiment) lift pins 211 inserted through the lift pin holes 145L, 128L and 171L. Each of the lift pins 211 can be moved between a delivery position (raised position) where an upper end of the lift pin 211 protrudes above the top surface 120A of the attraction plate 120 and a processing position (lowered position) where the upper end of the lift pin 211 is located under the top surface 120A of the attraction plate 120.

A push rod 212 is provided under each lift pin 211. The push rod 212 can be moved up and down by an elevating mechanism 213, for example, an air cylinder. By pushing lower ends of the lift pins 211 upwards with the push rods 212, the lift pins 211 can be raised to the delivery position. Alternatively, a plurality of push rods 212 may be provided at a ring-shaped supporting body (not shown) centered on the rotation axis Ax and moved up and down by moving the ring-shaped supporting body up and down by a common elevating mechanism.

The wafer W loaded on the lift pins 211 at the delivery position is located at a height position higher than an upper end 809 of the stationary outer cup component 801, and this wafer W can be delivered to/from an arm (see FIG. 1) of the substrate transfer device (module-outside transfer device) 17 that has advanced into the second rotational liquid processing unit 2001.

If the lift pins 211 are apart from the push rods 212, the lift pins 211 are lowered down to the processing position by an elastic force of a return spring 214 and held at the processing position. In FIG. 6, a reference numeral 215 denotes a guide member configured to guide a vertical movement of the lift pin 211 and a reference numeral 216 denotes a spring seat configured to receive the return spring 214. Further, a circular ring-shaped recess 810 is formed at the stationary inner cup component 804 to allow a rotation of the spring seat 216 around the rotation axis Ax.

As shown in FIG. 6, the processing liquid supply 700 is equipped with a plurality of nozzles configured to supply the processing liquid to the wafer W. The plurality of nozzles includes at least a plating liquid nozzle 701 configured to supply a plating liquid to the wafer W. The plurality of nozzles may also include a nozzle 702 configured to supply a cleaning liquid, a pre-wet liquid or the like to the wafer W, a nozzle 703 configured to supply a cleaning liquid for cleaning the rotary table 100 and the cup 800 and the like.

A chemical liquid is supplied into the plating liquid nozzle 701 from a plating liquid source 701A through a chemical liquid supply mechanism 701B including a flow controller (not shown), such as an opening/closing valve and a flow rate control valve, provided in a plating liquid supply line (pipe) 701C. A heater 701D serving as a temperature control mechanism for controlling the temperature of the plating liquid may be provided in the plating liquid supply line 701C. Further, a tape heater (not shown) for controlling the temperature of the plating liquid may be provided in the pipe constituting the plating liquid supply line 701C.

Desired processing liquids are also supplied into the other nozzles 702 and 703 from processing liquid sources 702A and 703A through processing liquid supply mechanisms 702B and 703B including flow controllers (not shown), such as opening/closing valves and flow rate control valves, provided in processing liquid supply lines (pipes) 702C and 703C, respectively.

The plating liquid nozzle 701 and the other nozzles 702 and 703 are supported by a tip end of a nozzle arm 704. A base end of the nozzle arm 704 is supported by a nozzle arm driving mechanism 705 configured to move up and down and revolve the nozzle arm 704. The nozzle arm driving mechanism 705 enables the plating liquid nozzle 701 and the other nozzles 702 and 703 to be located at a certain position in the radial direction above the wafer W (a position in the radial direction of the wafer W).

A wafer sensor 860 configured to detect presence or absence of the wafer W on the rotary table 100, and one or more infrared thermometers 870 (only one is illustrated) configured to detect the temperature of the wafer W (or the temperature of the processing liquid on the wafer W) are disposed at the ceiling of the housing 1601. If a plurality of infrared thermometers 870 is provided, desirably, the infrared thermometers 870 detect the temperatures of regions of the wafer W corresponding to the heating zones 143-1 to 143-10, respectively.

As shown in FIG. 3 and FIG. 4, a circular plate-shaped top plate 950 having substantially the same diameter as the wafer W may also be provided within the second liquid processing device 2000. The top plate 950 may have a heater 952 embedded therein. The top plate 950 can be moved between a cover position and a standby position by a plate moving mechanism 960.

The cover position of the top plate 950 refers to a position where the top plate 950 is close to the wafer held on the rotary table 100, as shown in the operational diagrams of FIG. 15I to FIG. 15L and FIG. 15R to FIG. 15T to be described later.

The standby position of the top plate 950 refers to a position where the top plate 950 is sufficiently far from the rotary table 100 not to interfere with a revolution of the nozzle arm 704 and not to interfere with carry-out/in operations of the wafer W with respect to the rotary table 100.

The standby position may be located outside the liquid recovery cup 800 when viewed from the top as shown in FIG. 3 and FIG. 4 or right above the liquid recovery cup 800 as shown in the operational diagrams of FIG. 15A to FIG. 15H and FIG. 15M to FIG. 15Q to be described later.

If the standby position is located outside the liquid recovery cup 800, the FFU may be placed in a typical manner (i.e., may be provided on a ceiling portion of the second liquid processing device 2000). In this case, the plate moving mechanism 960 functions to move the top plate 950 vertically and horizontally. If the second liquid processing device 2000 performs only a plating processing to be described later, it is not necessary to form a downflow within the second liquid processing device 2000, so that, the FFU may be provided on a side wall of the housing 1601. Therefore, if the standby position of the top plate 950 is located right above the liquid recovery cup 800, it is possible to simplify a structure of the plate moving mechanism 960 and reduce a footprint of the second liquid processing device 2000.

The top plate 950 is not illustrated in FIG. 6 due to lack of illustration space. If the standby position of the top plate 950 is located outside the liquid recovery cup 800, the top plate 950 is located behind the nozzle arm 704 in FIG. 6. Also, if the standby position of the top plate 950 is located right above the liquid recovery cup 800, the top plate 950 is located between the nozzle arm 704 and the ceiling of the housing 1601 in FIG. 6.

As schematically illustrated in FIG. 3, the top plate 950 may be equipped with an inert gas nozzle 980. The inert gas nozzle 980 serves to supply an inert gas, for example, a nitrogen gas ($N_2$ gas), toward a space under the top plate 950 (a space between a surface of the plating liquid on the wafer W and a bottom surface of the top plate 950). The inert gas supplied from the inert gas nozzle 980 may be temperature-controlled (heated).

Instead of providing the inert gas nozzle 980 at the top plate 950, or in addition to providing the inert gas nozzle 980 at the top plate 950, an inert gas supply may be provided at a peripheral portion of the rotary table 100. Specifically, for example, as shown schematically by a dashed line in FIG. 12, it may be composed of a gas passageway that communicates with the recess region 125G in the top surface 120A of the attraction plate 120 or the through holes 129G. For example, the gas passageway extends inside the attraction plate 120 and the periphery cover body 180 to be opened to the inner peripheral surface 185 of the upper portion 181 of the periphery cover body 180. Thus, the inert gas (e.g., a nitrogen gas) can be supplied into the space between the surface of the plating liquid on the wafer W and the bottom surface of the top plate 950. An appropriate seal (a seal such as the O-ring 192) may be provided near the attraction plate 120 and the periphery cover body 180 through which the gas passageway penetrates. In this case, the inert gas is used as the purge gas described above.

Also, as schematically illustrated in FIG. 3, desirably, the top plate 950 may have an annular surrounding member 954 that protrudes downwards from a periphery of the bottom surface of the top plate 950. The surrounding member 954 laterally surrounds the space between the bottom surface of the top plate and the liquid surface of the plating liquid on the wafer W when the top plate 950 is located at the cover position. Thus, a space near the liquid surface of the plating liquid can be reliably made in a non-oxidative atmosphere by the inert gas supplied from the inert gas nozzle 980, and oxidation of the plating liquid can be suppressed. Further, it becomes easier to keep warmth of the wafer W and the plating liquid on the wafer W, and it becomes easier to maintain the composition of the plating liquid. Desirably, a lower end of the surrounding member 954 is located near an outer peripheral surface of an upper portion of the periphery cover body 180 when the top plate 950 is located at the cover position.

Hereinafter, a series of processing sequences to be performed on a single wafer W by the liquid processing module 16 will be described with reference to FIG. 15A to FIG. 15T. The operations to be described below can be performed when the control device 4 (controller 18) illustrated in FIG. 1 controls the operations of the components of the substrate transfer device 17 and the liquid processing module 16.

Figure 15A:
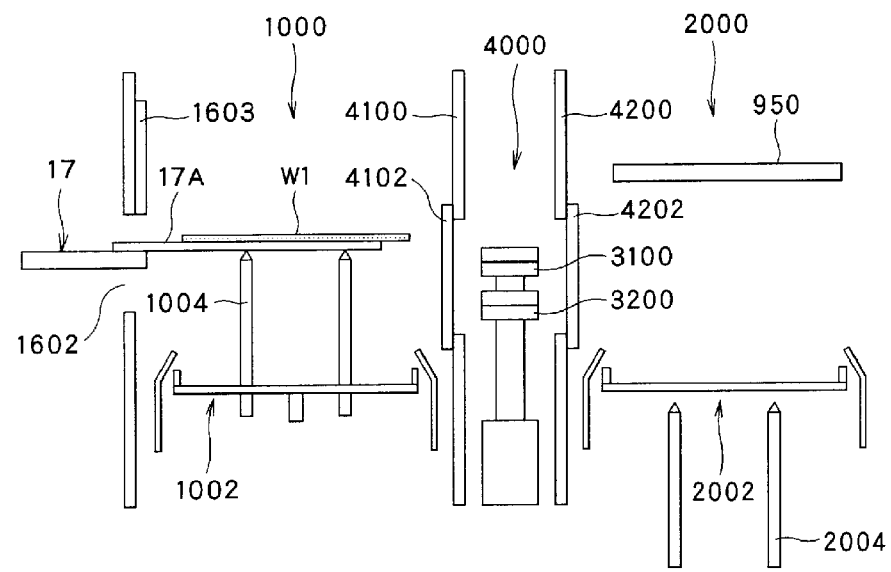
FIG. 15A is a schematic diagram for explaining an operation sequence of the liquid processing module.

First, as shown in FIG. 15A, the shutter 1603 is opened so that the transfer arm 17A of the substrate transfer device (module-outside transfer device) 17 carries a non-processed wafer W (meaning a first wafer to be assigned reference numeral W1) into the first liquid processing device 1000 through the carry-out/in opening 1602. The transfer arm 17A locates the wafer W1 right above the first spin chuck 1002. Then, the tip ends of the lift pins 1004 stand by slightly under the wafer W1.

Thereafter, the lift pins 1004 receive the wafer W1 from the transfer arm 17A that has unclamped the wafer W1. Then, the transfer arm 17A is retreated from the first liquid processing device 1000. Thereafter, the shutter 1603 is closed.

Figure 15B:
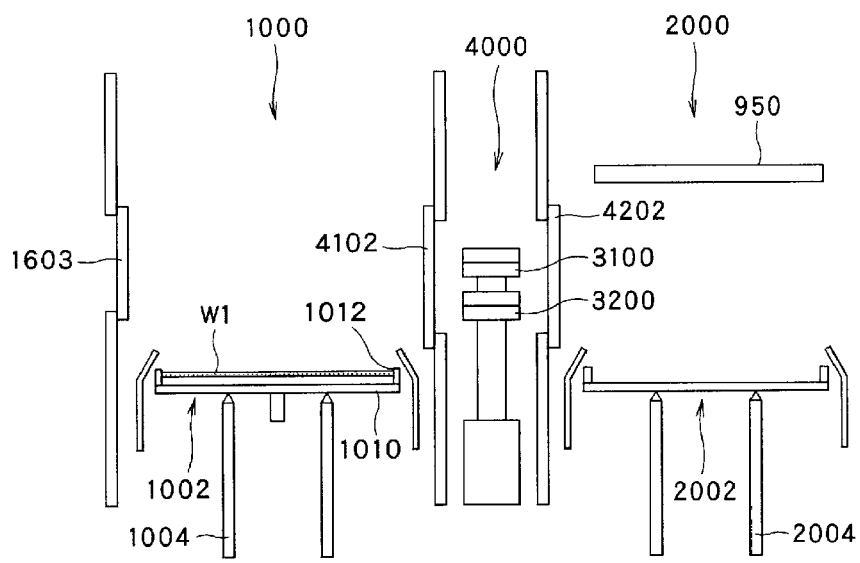
FIG. 15B is a schematic diagram for explaining the operation sequence of the liquid processing module.

The lift pins 1004 that have received the wafer W1 are moved down to the height position where the grip claws 1012 of the first spin chuck 1002 can grip the wafer W1. Then, the wafer W1 is held by the grip claws 1012 of the first spin chuck 1002. Thereafter, the lift pins 1004 are moved down so that the top ends of the lift pins 1004 can be located on the same plane as or lower than the top surface of the base plate 1010. This state is shown in FIG. 15B.

Then, the first liquid processing device 1000 performs the pre-processing (pre-processing of the plating processing) on the wafer W1. In the exemplary embodiment, the pre-processing includes a pre-cleaning process, a first rinsing process, a palladium imparting process, a second rinsing process and a drying process. Hereinafter, each process will be described.

<Pre-Cleaning Process>

The first spin chuck 1002 configured to hold the wafer W1 horizontally in the first liquid processing device 1000 rotates the wafer W1 around the vertical axis line. Among the plurality of processing liquid nozzles 1034, the processing liquid nozzle 1034 configured to supply the cleaning liquid for pre-processing is located right above the central portion of the wafer W1 being rotated and supplies the cleaning liquid for pre-processing to the wafer W1. The supplied chemical liquid flows toward the peripheral portion of the front surface (the top surface) of the wafer W1 to be scattered to the outside of the wafer W1 by the centrifugal force. Here, the entire front surface of the wafer W1 is covered with the liquid film of the chemical liquid. This state is kept for a predetermined time period (e.g., 1 minute).

<First Rinsing Process>

Then, the supply of the cleaning liquid for pre-processing is stopped, and the rinse liquid DIW is supplied to the central portion of the wafer W1 being rotated from the processing liquid nozzle 1034 configured to supply the rinse liquid. The chemical liquid and reaction products remaining on the wafer W1 are washed off by the supplied rinse liquid. This state is kept for a predetermined time period (e.g., 30 seconds).

<Catalyst Imparting Process>

Thereafter, the supply of the rinse liquid is stopped, and the catalyst solution (e.g., the palladium nanoparticle-containing solution) is supplied to the central portion of the wafer W1 being rotated from the processing liquid nozzle 1034 configured to supply the catalyst solution. The rinse liquid remaining on the wafer W1 is replaced with the catalyst solution, and the entire front surface of the wafer W1 is covered with the liquid film of the catalyst solution. This state is kept for a predetermined time period (e.g., 30 seconds).

<Second Rinsing Process>

Then, the supply of the catalyst solution is stopped, and the rinse liquid DIW is supplied to the central portion of the wafer W1 being rotated from the processing liquid nozzle 1034 configured to supply the rinse liquid which is used in the first rinsing process. The surplus catalyst particles remaining on the wafer W1 are washed off by the supplied rinse liquid. This state is kept for a predetermined time period (e.g., 30 seconds).

Figure 15C:
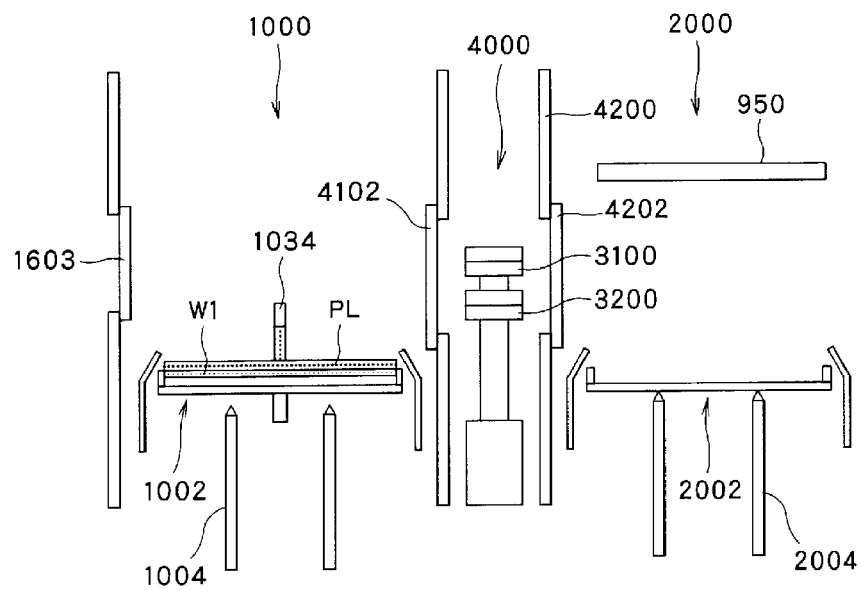
FIG. 15C is a schematic diagram for explaining the operation sequence of the liquid processing module.

Also, the state from the pre-cleaning process to the second rinsing process is shown in FIG. 15C.

<Drying Process>

Thereafter, the discharge of the rinse liquid from the processing liquid nozzle 1034 is stopped. Slightly before the discharge of the rinse liquid is stopped, the discharge of the IPA (drying liquid) toward the central portion of the front surface of the wafer W1 from the nozzle 1036 is started. After the discharge of the rinse liquid from the processing liquid nozzle 1034 is stopped, the discharge of the IPA toward the central portion of the front surface of the wafer W1 from the drying liquid nozzle 1036 is continued. Thus, the rinse liquid DIW remaining on the front surface of the wafer W1 is replaced with the IPA. When the replacement of the IPA is sufficiently performed, the drying liquid nozzle 1036 is moved to shift a liquid landing position of the IPA on the front surface of the wafer W1 to the periphery of the wafer W1. Here, a circular dry region (dry core) is formed at the central portion of the front surface of the wafer W1. Then, along with the movement of the drying liquid nozzle 1036, the dry core is spread to the periphery of the wafer W1, and, thus, the entire front surface of the wafer W1 is dried.

Figure 15D:
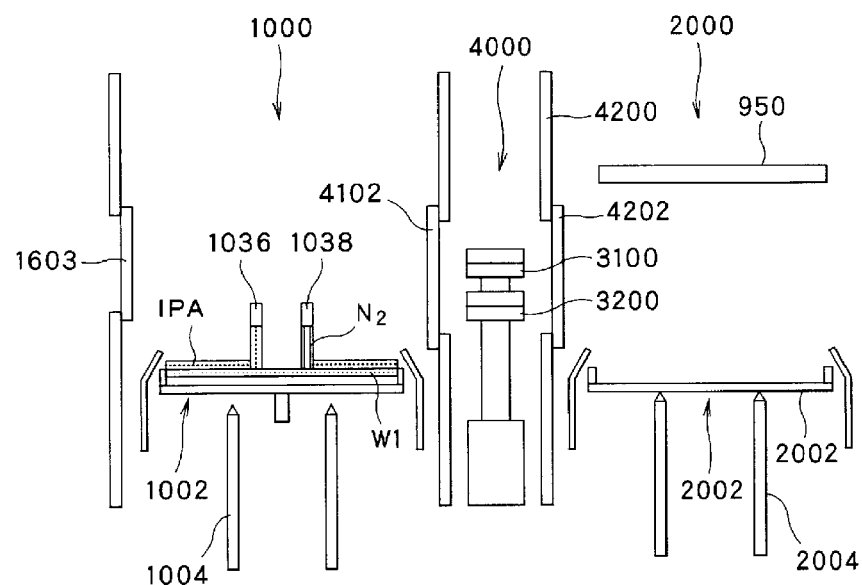
FIG. 15D is a schematic diagram for explaining the operation sequence of the liquid processing module.

When the drying liquid nozzle 1036 starts to move, the gas nozzle 1038 is located right above the central portion of the wafer W1 and the discharge of the nitrogen gas (drying gas) toward the central portion of the wafer W1 is started. Then, by moving the gas nozzle 1038 as shown in FIG. 15D, a discharge position (corresponding to an intersection point between an axis line of a discharge opening of the gas nozzle 1038 and the wafer W1) of the nitrogen gas on the front surface of the wafer W1 is shifted to the periphery of the wafer W1. While a distance between the liquid landing position of the IPA and the rotation center of the wafer W1 is kept greater than a distance between the discharge position of the nitrogen gas and the rotation center of the wafer W1, the nozzles 1036 and 1038 are moved. Accordingly, it is possible to accelerate the drying of the IPA and suppress the generation of the particles. The time required for the drying process is, e.g., 1 minute. Accordingly, the pre-processing (pre-processing of the plating processing) on the wafer W1 is completed.

Then, the lift pins 1004 are moved up and the tip ends of the lift pins 1004 are located slightly under the bottom surface of the wafer W1. Thereafter, the grip claws 1012 of the first spin chuck 1002 release the wafer W1. Then, the lift pins 1004 are moved up to move the wafer W1 up. The lift pins 1004 locate the wafer W1 at a suitable height position for the delivery of the wafer W1 between the lift pins 1004 and the first arm 3100.

Figure 15E:
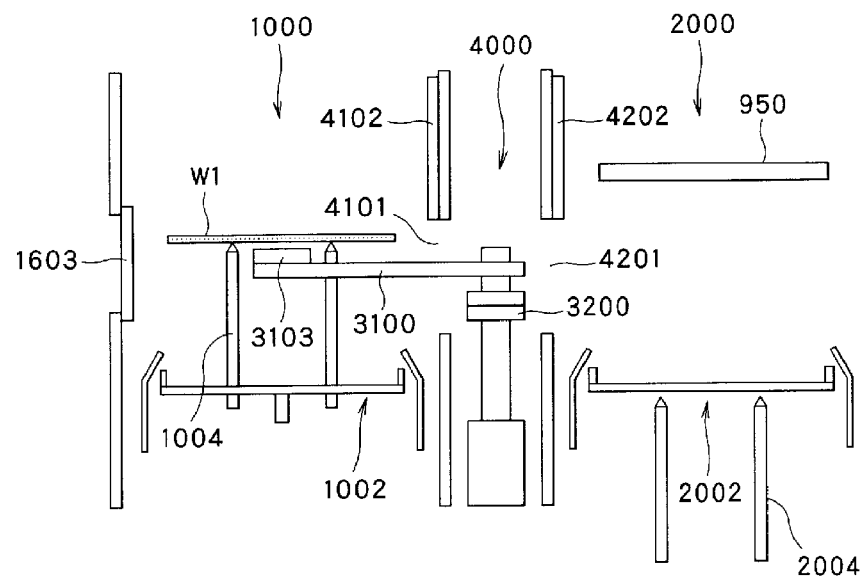
FIG. 15E is a schematic diagram for explaining the operation sequence of the liquid processing module.

Then, the shutters 4102 and 4202 are opened so that the first arm 3100 enters the first liquid processing device 1000 through the opening 4101 and is located under the wafer W1 supported by the lift pins 1004 (see FIG. 15E). Thereafter, the vacuum chuck 3103 of the first arm 3100 receives the wafer W1 from the lift pins 1004. The vacuum chuck 3103 vacuum-attracts the wafer W1.

Further, the wafer W may be delivered between the lift pins 1004 and the transfer arm 17A by a relative up-down movement between the lift pins 1004 and the transfer arm 17A, and the relative up-down movement may be performed by moving any one side of the lift pins 1004 and the transfer arm 17A. That is, an up-down movement function for implementing the relative up-down movement for the delivery of the wafer W just needs to be performed by at least any one side of the lift pins 1004 and the transfer arm 17A. Furthermore, before the transfer arm 17A delivers the wafer W to the lift pins 1004, the transfer arm 17A unclamps the wafer W. After the transfer arm 17A receives the wafer W from the lift pins 1004, the transfer arm 17A clamps the wafer W. The descriptions in this paragraph will be omitted in the following description of the operations.

Likewise, the wafer W may be delivered between the lift pins 1004 and 2004 and the vacuum chucks 3103 and 3203 by the relative up-down movement between the lift pins and the vacuum chucks, and the relative up-down movement may be performed by moving any one side of the lift pins and the vacuum chucks (i.e., first or second arm). That is, an up-down movement function for implementing the relative up-down movement for the delivery of the wafer W just needs to be performed by at least any one side of the lift pins and the vacuum chucks. Further, before the vacuum chucks 3103 and 3203 deliver the wafer W to the lift pins 1004 and 2004, the vacuum chucks release the vacuum attraction of the wafer W. After the vacuum chucks 3103 and 3203 deliver the wafer W to the lift pins 1004 and 2004, the vacuum chucks vacuum-attract the wafer W. The descriptions in this paragraph will be omitted in the following description of the operations.

Then, the first arm 3100 enters the second liquid processing device 2000 through the openings 4101 and 4201 and locates the wafer W1 right above the second spin chuck 2002 (corresponding to the rotary table 100 illustrated in FIG. 6). Here, the tip ends of the lift pins 2004 (corresponding to the lift pins 211 illustrated in FIG. 6) stand by slightly under the wafer W1 (see FIG. 15F). Then, the lift pins 2004 receive the wafer W1 from the vacuum chuck 3103. Thereafter, the first arm 3100 is retreated from the second liquid processing device 2000 and is moved into the arm standby space 4000. Then, the shutters 4102 and 4202 are closed. The lift pins 2004 supporting the wafer W1 are moved down, and, thus, the wafer W1 is placed on the second spin chuck 2002. The second spin chuck 2002 configured as the vacuum chuck attracts the wafer W1 (see FIG. 15G).

Figure 15F:
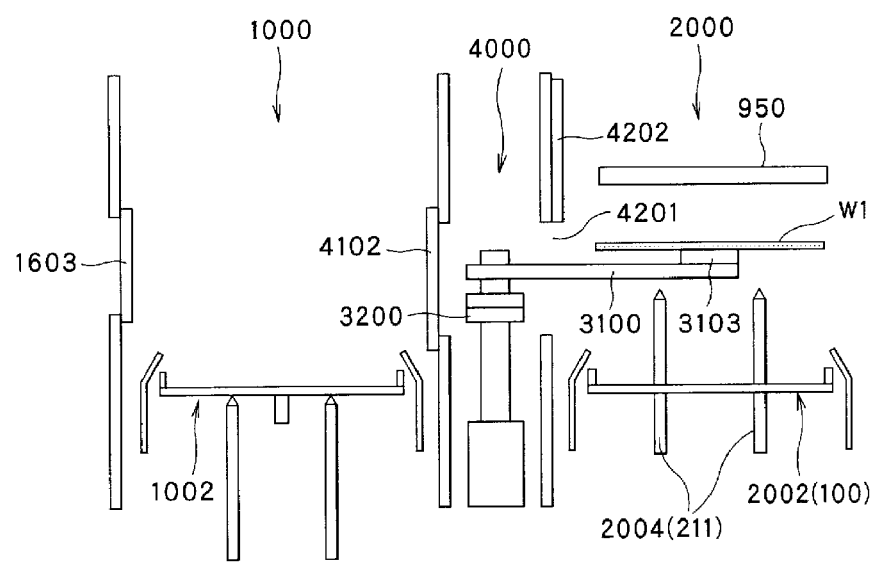
FIG. 15F is a schematic diagram for explaining the operation sequence of the liquid processing module.
Figure 15G:
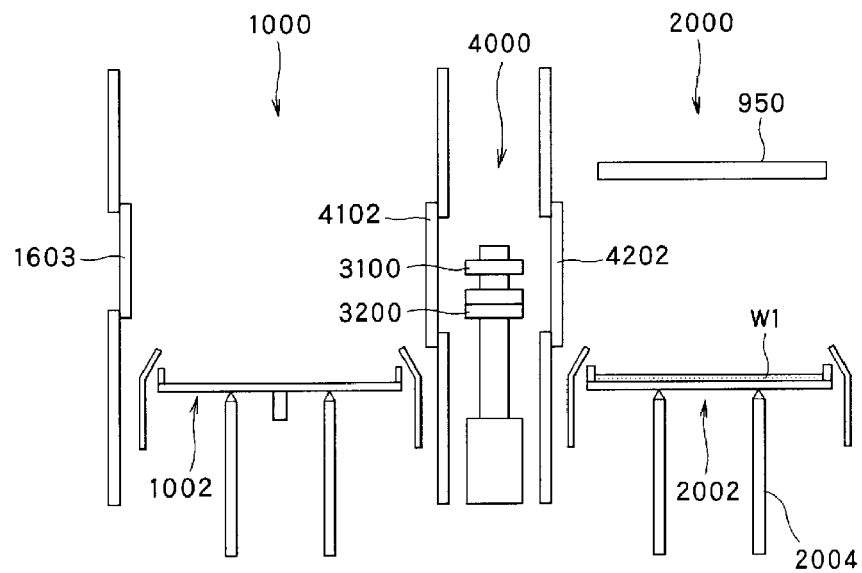
FIG. 15G is a schematic diagram for explaining the operation sequence of the liquid processing module.
Figure 15H:
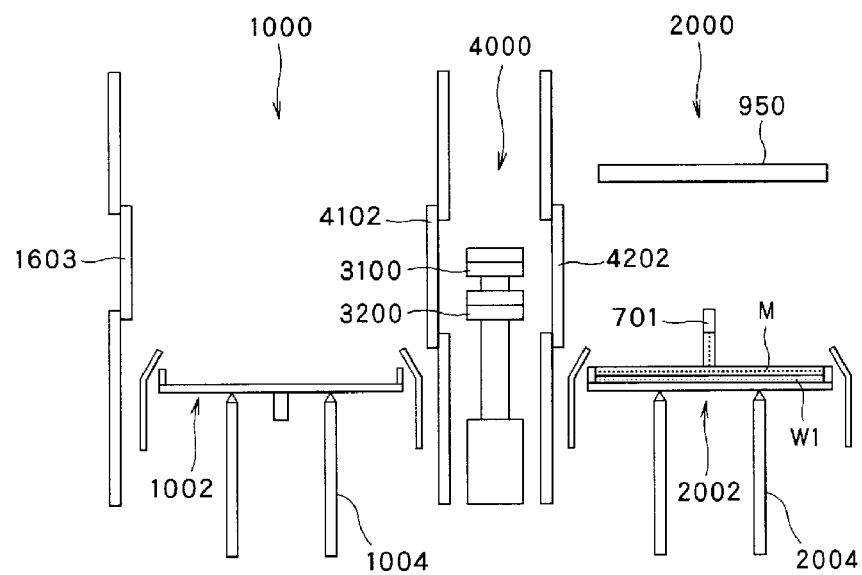
FIG. 15H is a schematic diagram for explaining the operation sequence of the liquid processing module.

Then, the electroless plating processing of the wafer W1 is performed by the second liquid processing device 2000. This processing is now briefly described and will be described in detail later. As illustrated in FIG. 15H, the plating liquid is supplied from the plating liquid nozzle 701 onto the wafer W1 being held and rotated on the second spin chuck 2002 and the film of the plating liquid is formed on the front surface of the wafer W1 (which is assigned reference numeral M). Thereafter, the rotation of the wafer W1 is stopped and then the supply of the plating liquid from the plating liquid nozzle 701 is stopped. Thus, the front surface of the wafer W1 is covered by the film of the stopped plating liquid (formation of plating liquid puddle).

Figure 15I:
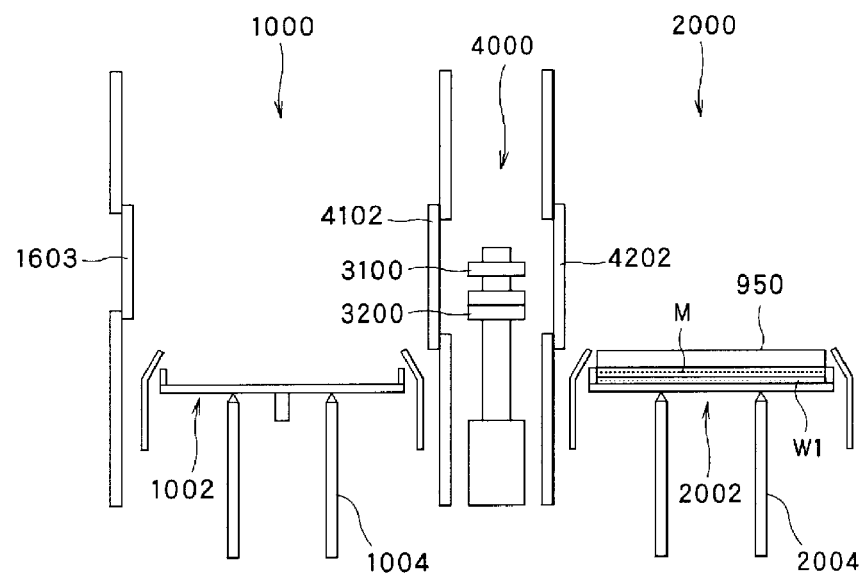
FIG. 15I is a schematic diagram for explaining the operation sequence of the liquid processing module.

Then, as illustrated in FIG. 15I, the top plate 950 is moved down to the position near the surface of the liquid film of the plating liquid on the wafer W1. The wafer W1 and the liquid film of the plating liquid are heated to a suitable temperature for forming the plating film by the heaters (corresponding to the heater 142 and the auxiliary heater 900 provided in the rotary table 100 illustrated in FIG. 6) embedded in the second spin chuck 2002.

Herein, the heater 952 embedded in the top plate 950 functions to keep warmth of the wafer W1 and the liquid film of the plating liquid. Further, the bottom surface of the top plate 950 has been heated by the heater 952, and, thus, vapor (water vapor) generated from the plating liquid heated on the wafer W1 does not condense on the bottom surface of the top plate 950. For this reason, a vapor pressure in the space (gap) between the surface of the liquid film of the plating liquid and the bottom surface of the top plate 950 is maintained. Therefore, it is possible to suppress the evaporation of the plating liquid and thus possible to maintain the concentration of the plating liquid within a desired range.

Within the second liquid processing device 2000, the above-described state where the front surface of the wafer W1 is covered with the liquid film of the heated plating liquid is maintained for a predetermined time period (e.g., 5 minutes). As a result, the plating film having the desired thickness is formed on the front surface of the wafer W1 (including inner surfaces of recesses (for example, vias) formed on the front surface). Further, the plating liquid on the wafer W1 may be stirred by rotating the wafer W1 by a half turn in a forward rotation direction and a backward rotation direction during the plating processing while the power is supplied to the heaters 142 and 900. Thus, it is possible to accelerate the formation of the plating film and improve the in-plane uniformity in film thickness and the quality of the plating film.

Figure 15J:
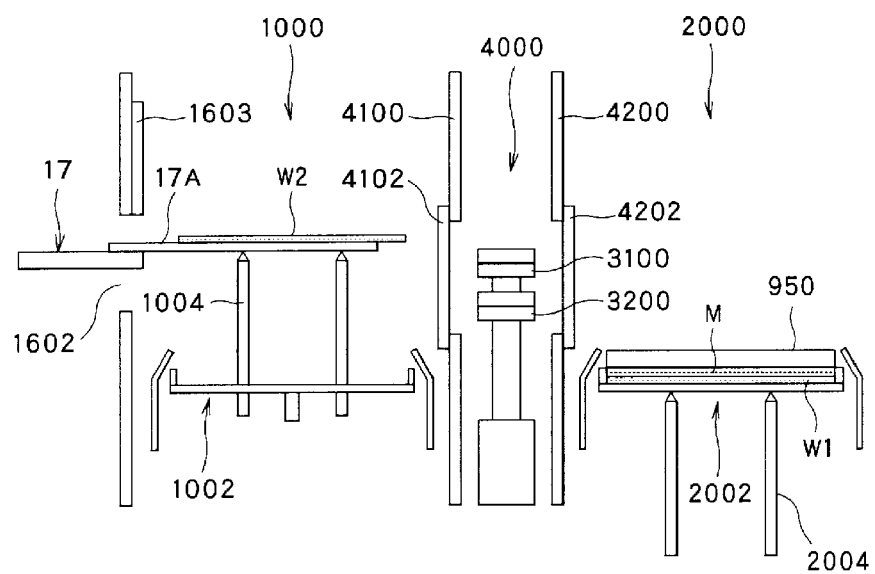
FIG. 15J is a schematic diagram for explaining the operation sequence of the liquid processing module.

When a predetermined time period has elapsed from the start of the plating processing within the second liquid processing device 2000, the shutter 1603 is opened and the transfer arm 17A of the substrate transfer device 17 carries a second non-processed wafer W2 into the first liquid processing device 1000 (see FIG. 15J). Then, the wafer W2 is delivered from the transfer arm 17A to the lift pins 1004 in the same sequence as that of the delivery of the wafer W1, and the wafer W2 is held on the first spin chuck 1002 (see FIG. 15K). Thereafter, a pre-processing on the wafer W2 is performed within the first liquid processing device 1000 in the same sequence as that of the pre-processing on the wafer W1 (see FIG. 15L and FIG. 15M). After the pre-processing, the front surface of the wafer W2 is dried.

Figure 15K:
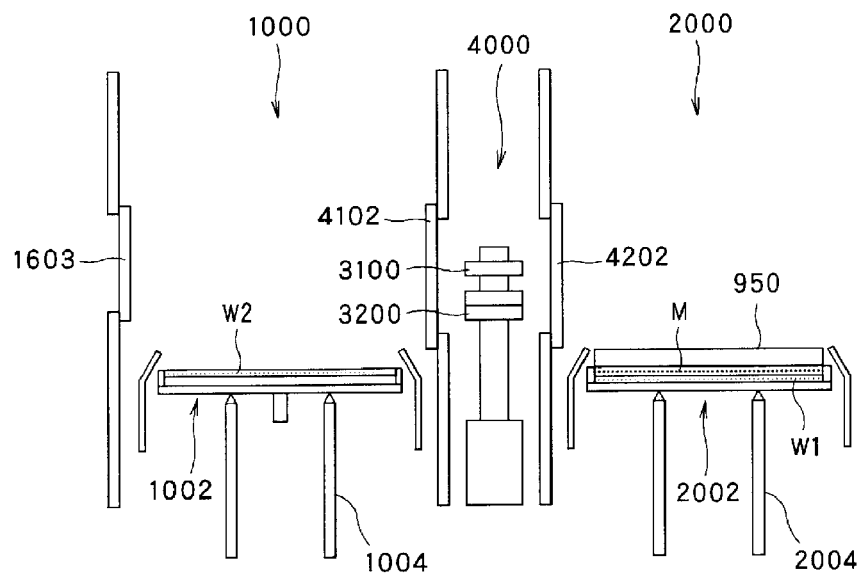
FIG. 15K is a schematic diagram for explaining the operation sequence of the liquid processing module.
Figure 15L:
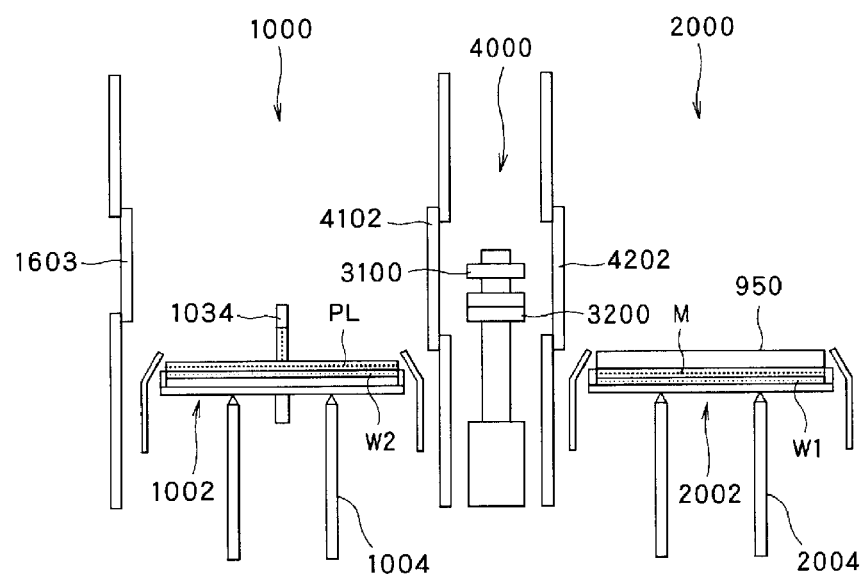
FIG. 15L is a schematic diagram for explaining the operation sequence of the liquid processing module.
Figure 15M:
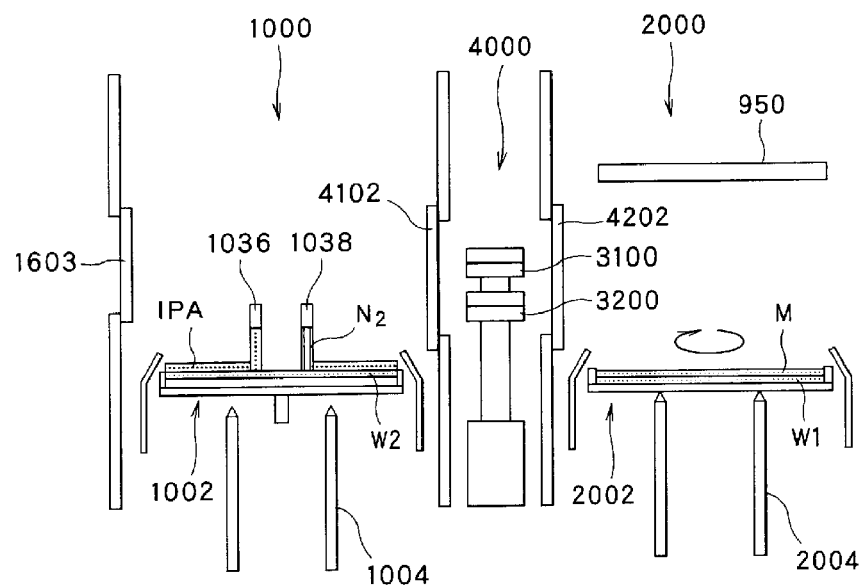
FIG. 15M is a schematic diagram for explaining the operation sequence of the liquid processing module.

When the plating film having the desired film thickness is formed within the second liquid processing device 2000, the top plate 950 is moved to the standby position as shown in FIG. 15M and then, the wafer W1 is rotated. Thus, some of the plating liquid remaining on the front surface of the wafer W1 is removed. Accordingly, the liquid film of the plating liquid on the front surface of the wafer W1 becomes thin. Here, the liquid film of the plating liquid has an adequate thickness so as not to overflow the wafer W1 when the wafer W1 is lifted by the lift pins 2004 or when the wafer W1 is transferred toward the first liquid processing device 1000 by the second arm 3200. The thickness of the liquid film of the plating liquid may be adjusted by adjusting the rotational speed of the wafer W1 to an appropriate value (a relatively low rotational speed). Here, if the wafer W1 is dried, it is difficult to remove the particles on the front surface of the wafer W1. When the liquid film of the plating liquid on the front surface of the wafer W1 is thinned to an appropriate thickness, the rotation of the wafer W1 is stopped. Accordingly, the electroless plating processing within the second liquid processing device 2000 is ended. The time required for the electroless plating processing is, e.g., 5 minutes. The maintenance time accounts for most of the required time.

When the pre-processing on the wafer W2 within the first liquid processing device 1000 is ended and the liquid film of the plating liquid on the front surface of the wafer W1 is thinned to the appropriate thickness within the second liquid processing device 2000, the wafer W1 and the wafer W2 are exchanged.

Figure 15N:
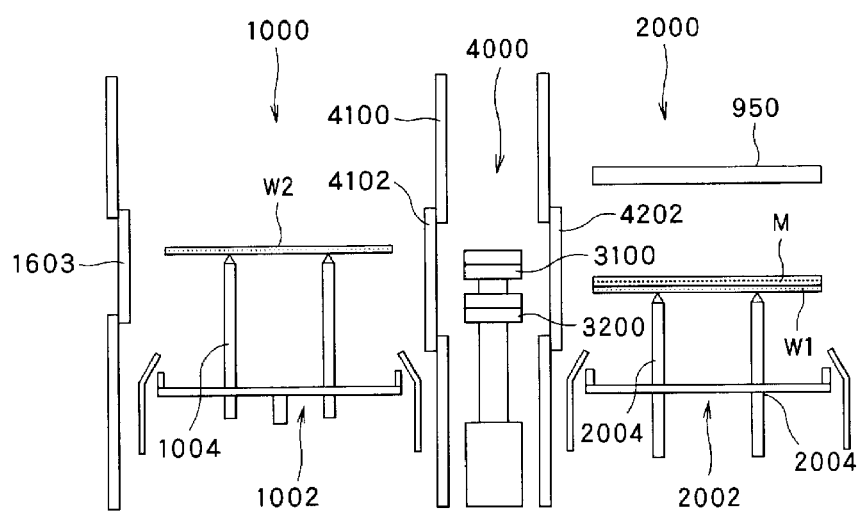
FIG. 15N is a schematic diagram for explaining the operation sequence of the liquid processing module.

That is, within the first liquid processing device 1000, the grip of the wafer W2 by the first spin chuck 1002 is released. Then, the wafer W2 is lifted by the lift pins 1004 and is located at the height position suitable for delivery between the lift pins 1004 and the first arm 3100. Meanwhile, within the second liquid processing device 2000, the attraction of the wafer W1 by the second spin chuck 2002 is released. Then, the wafer W1 is lifted by the lift pins 2004 and is located at the height position suitable for delivery between the lift pins 2004 and the second arm 3200. This state is shown in FIG. 15N. Desirably, the operation of moving up the wafer W2 within the first liquid processing device 1000 and the operation of moving up the wafer W1 within the second liquid processing device 2000 may be performed substantially at the same time.

Figure 15O:
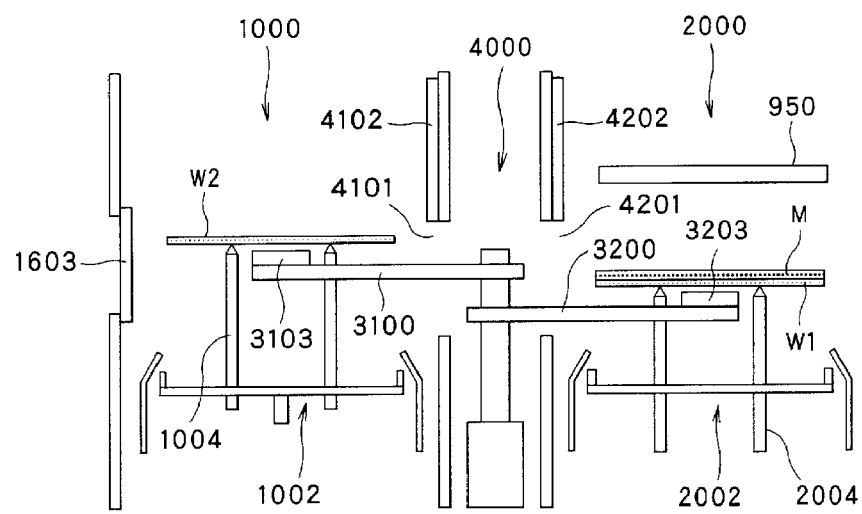
FIG. 15O is a schematic diagram for explaining the operation sequence of the liquid processing module.

Then, as shown in FIG. 15O, the shutters 4102 and 4202 are opened, and the vacuum chuck 3103 of the first arm 3100 is located slightly under the wafer W2 held by the lift pins 1004. Further, the vacuum chuck 3203 of the second arm 3200 is located slightly under the wafer W1 held by the lift pins 2004. Thereafter, according to the method described above, the first arm 3100 receives the wafer W2 from the lift pins 1004 and the second arm 3200 receives the wafer W1 from the lift pins 2004. Then, the lift pins 1004 and lift pins 2004 are moved down and up to the height positions suitable for wafer transfer between the second arm 3200 and the first arm 3100 holding the wafer W1 and the wafer W2, respectively.

Figure 15P:
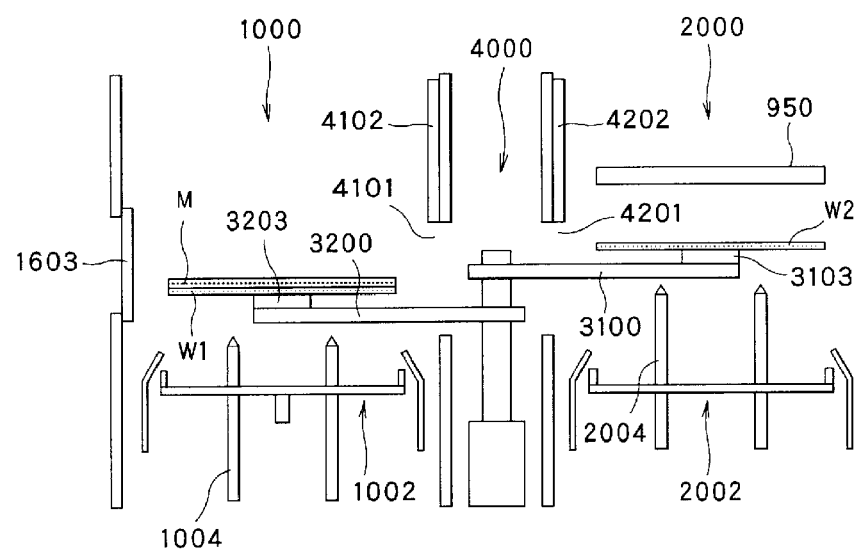
FIG. 15P is a schematic diagram for explaining the operation sequence of the liquid processing module.

Thereafter, as shown in FIG. 15P, the first arm 3100 and the second arm 3200 rotate almost at the same time. As a result, the first arm 3100 carries the wafer W2 into the second liquid processing device 2000 and locates it directly above the second spin chuck 2002. Further, the second arm 3200 carries the wafer W1 into the first liquid processing device 1000 and locates it directly above the first spin chuck 1002. That is, the wafer W1 and the wafer W2 are exchanged between the first liquid processing device 1000 and the second liquid processing device 2000.

During the exchange operation, the wafer W2 held by the first arm 3100 is dried and the wafer W1 held by the second arm 3200 has the thin liquid film of the plating liquid formed on the front surface thereof. During the exchange operation, the revolution trajectory of the second arm 3200 (the movement trajectory of the wafer W1) is under the revolution trajectory of the first arm 3100 (the movement trajectory of the wafer W2). Therefore, even if the plating liquid present on the wafer W1 overflows, there is no concern that the wafer W2 will be wet with the plating liquid.

Desirably, the revolution of the first arm 3100 and the revolution of the second arm 3200 may be performed completely simultaneously, but the revolution of the first arm 3100 and the revolution of the second arm 3200 may be performed at slightly different timings.

Figure 15Q:
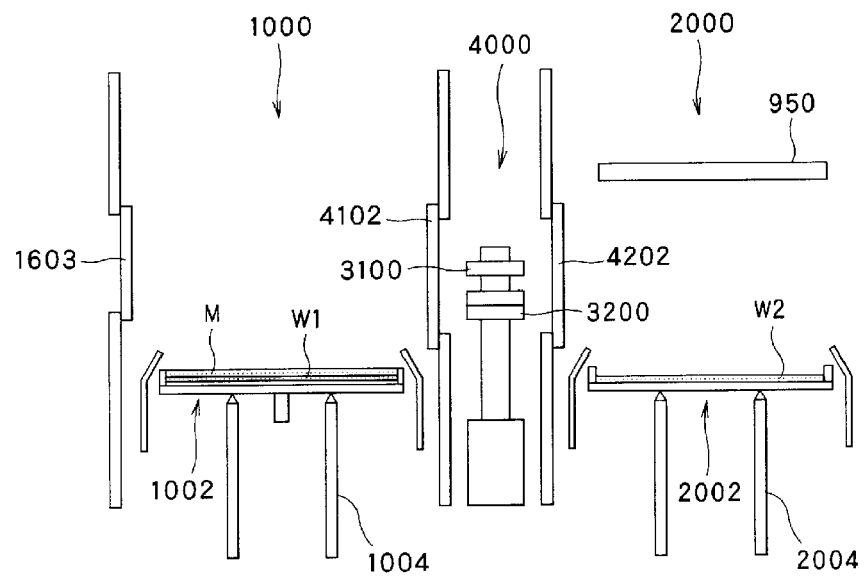
FIG. 15Q is a schematic diagram for explaining the operation sequence of the liquid processing module.

Then, according to the method described above, the wafer W2 is delivered from the first arm 3100 to the lift pins 2004, delivered from the lift pins 2004 to the second spin chuck 2002, and held by the second spin chuck 2002. Further, the wafer W1 is delivered from the second arm 3200 to the lift pins 1004, delivered from the lift pins 1004 to the first spin chuck 1002, and held by the first spin chuck 1002. This state is shown in FIG. 15Q. Thereafter, the lift pins 1004 and 2004 are moved down to the positions where the lift pins 1004 and 2004 do not interfere with the rotation of the first spin chuck 1002 and the rotation of the second spin chuck 2002. After delivering the wafers W2 and W1 to the lift pins 2004 and 1004, the first arm 3100 and the second arm 3200 are retreated into the arm standby space 4000, and the shutters 4102 and 4202 are closed. This state is shown in FIG. 15Q.

Then, the first liquid processing device 1000 performs the post-processing of the plating on the wafer W1 and the second liquid processing device 2000 performs the electroless plating processing on the wafer W2.

The post-processing of the plating performed by the first liquid processing device 1000 includes a post-processing on the front surface of the wafer W1 and a post-processing on the rear surface of the wafer W1. The post-processing is performed while the wafer W1 is rotated by the first spin chuck 1002.

The post-processing on the front surface of the wafer W1 includes a post-cleaning process, a subsequent rinsing process and a subsequent drying process. The post-cleaning process is substantially the same as the pre-cleaning process included in the pre-processing except for a cleaning liquid (a cleaning liquid for post-processing is used). The rinsing process and the drying process included in the post-processing are substantially the same as the first rinsing process and the drying process included in the pre-processing, respectively.

The post-processing on the rear surface of the wafer W1 includes a post-cleaning process, a subsequent rinsing process and a subsequent drying process. The post-cleaning process, the rinsing process and the drying process on the rear surface of the wafer W1 may be performed in the same time period as the post-cleaning process, the rinsing process and the drying process on the front surface of the wafer W1, respectively.

Figure 15R:
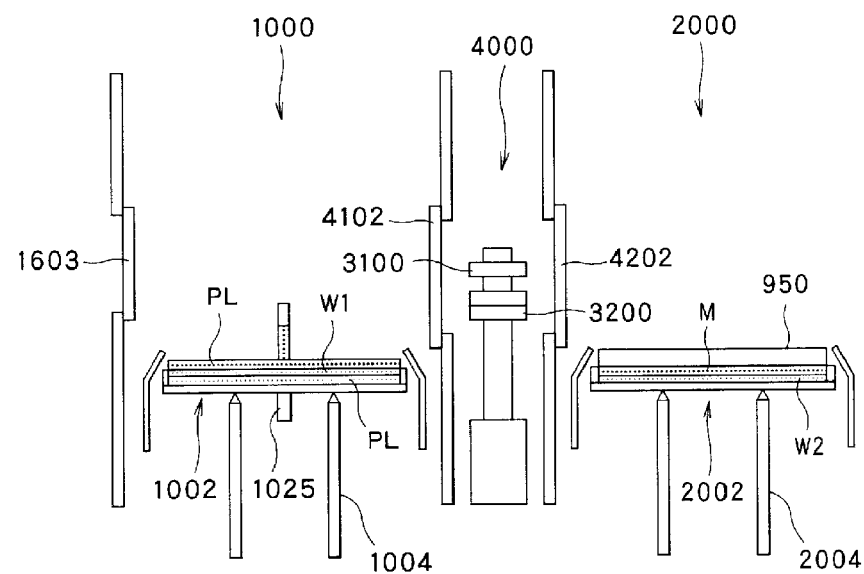
FIG. 15R is a schematic diagram for explaining the operation sequence of the liquid processing module.

The post-cleaning process on the rear surface of the wafer W1 may be performed by discharging a cleaning liquid for post-processing (e.g., a mixed solution of malic acid and hydrogen peroxide) from the top end portion (lower nozzle) of the processing fluid supply member 1025. The cleaning liquid supplied from the lower nozzle to the central portion of the rear surface of the wafer W1 being rotated flows toward the peripheral portion of the rear surface of the wafer W1 by the centrifugal force to be scattered to the outside of the wafer W1. Here, the entire rear surface of the wafer W1 is covered with the liquid film of the rinsing liquid. The plating liquid that flows into the rear surface of the wafer W1 can be removed by the cleaning liquid that flows on the rear surface of the wafer W1. The rinsing process on the rear surface of the wafer W1 may also be performed by discharging the rinsing liquid (e.g., DIW) from the top end portion of the processing fluid supply member 1025. For the above, refer to FIG. 15R. In FIG. 15R, reference numeral PL denotes the liquid film of the processing liquid.

The drying process on the rear surface of the wafer W1 may be performed by stopping the supply of the rinse liquid from the top end portion (lower nozzle) of the processing fluid supply member 1025 while continuing the rotation of the wafer W1 (scattering drying). Here, by supplying the inert gas (the nitrogen gas) from the top end portion (lower nozzle) of the processing fluid supply member 1025, it is possible to accelerate the drying and suppress the generation of the particles.

If only the peripheral portion of the rear surface of the wafer W1 is cleaned in the post-processing, the first spin chuck 1002 provided in the first liquid processing device 1000 may be a vacuum chuck configured to attract the central portion of the bottom surface (rear surface) of the wafer W1 (not to come into contact with the peripheral portion of the bottom surface of the wafer W1). In this case, one or more nozzles for supplying the processing fluid required for the peripheral portion are provided under the peripheral portion of the bottom surface of the wafer W1 held by the vacuum chuck.

Here, as described above, the time required for the post-processing of the plating is, for example, 2 minutes and the time required for the electroless plating processing is, for example, 5 minutes. Therefore, it is to be noted that there is a time period of about 3 minutes from the end of the post-processing to the end of the electroless plating processing.

Figure 15S:
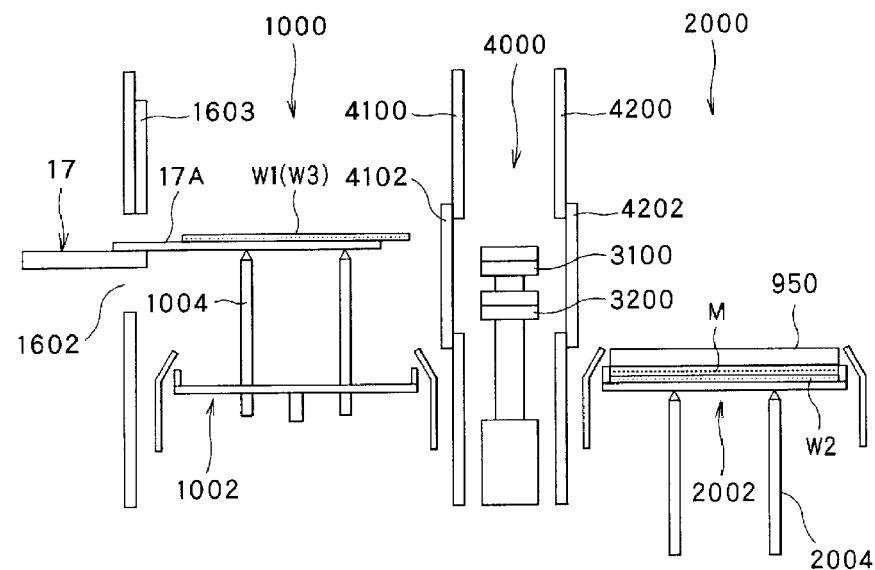
FIG. 15S is a schematic diagram for explaining the operation sequence of the liquid processing module.

When the post-processing of the plating in the first liquid processing device 1000 is completed, the lift pins 1004 receive the wafer W1 from the first spin chuck 1002 and lift the received wafer W1 to a position suitable for delivery to and from the transfer arm 17A. Also, the shutter 1603 is opened. Then, the empty transfer arm 17A enters the first liquid processing device 1000, receives the first wafer W1 from the lift pins 1004, and is retreated from the first liquid processing device 1000. Thereafter, as shown in FIG. 15S, the transfer arm 17A holding a third wafer W3 enters the first liquid processing device 1000, delivers the wafer W3 to the lift pins 1004, and is retreated from the first liquid processing device 1000. Then, the shutter 1603 is closed.

In an appropriate exemplary embodiment, the substrate transfer device (module-outside transfer device) 17 is equipped with two transfer arms 17A and the wafer W1 is carried out and the wafer W3 is carried in by a pick and place manner. That is, in a state where one of the transfer arms 17A holds the wafer W3 and the other transfer arm 17A is empty, the substrate transfer device 17 is placed to face the liquid processing module 16. Then, only the transfer arms 17A of the substrate transfer device 17 are moved without moving the base portion of the substrate transfer device 17 so that the carry-out of the wafer W1 and the carry-in of the wafer W3 are sequentially performed. However, the substrate transfer device 17 may be equipped with only one transfer arm 17A.

Figure 15T:
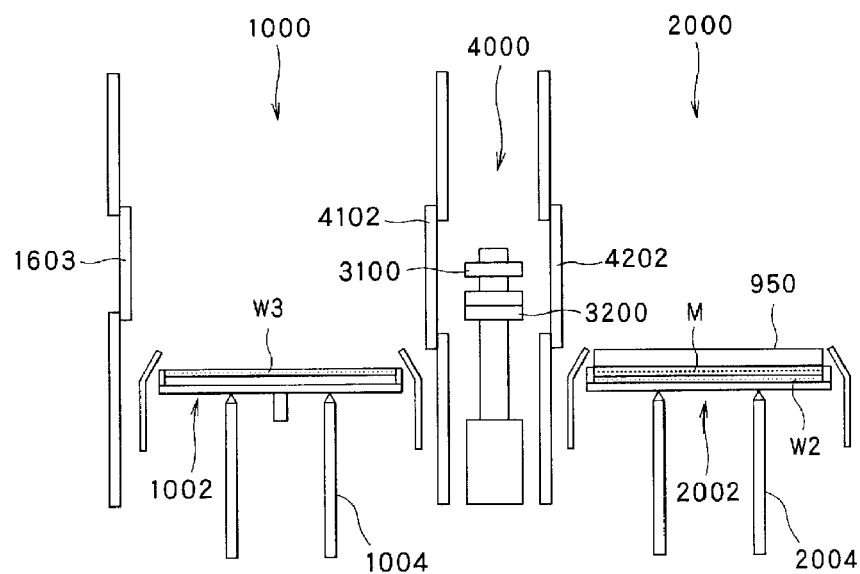
FIG. 15T is a schematic diagram for explaining the operation sequence of the liquid processing module.

Then, the first spin chuck 1002 receives the wafer W3 from the lift pins 1004 and holds the wafer W3 (FIG. 15T). Here, the states of the first liquid processing device 1000 and the second liquid processing device 2000 are identical to those as illustrated in FIG. 15K. Thereafter, a cycle of the operations shown in FIG. 15K (FIG. 15T), FIG. 15L, FIG. 15M, FIG. 15N, FIG. 15O, FIG. 15P, FIG. 15Q, FIG. 15R, FIG. 15S and FIG. 15K (FIG. 15T) is repeated.

In the above-described exemplary embodiment, the shutters 4102 and 4202 are closed except when the wafer W is transferred between the first liquid processing device 1000 and the second liquid processing device 2000. Thus, there is no concern that cross-contamination may occur between the first liquid processing device 1000 and the second liquid processing device 2000. Further, the first arm 3100 and the second arm 3200 are retreated into the arm standby space 4000 except when the wafer W is transferred between the first liquid processing device 1000 and the second liquid processing device 2000. Thus, the first arm 3100 and the second arm 3200 are not contaminated by the atmospheres inside the first liquid processing device 1000 and the second liquid processing device 2000.

As is clear from the above description, while the electroless plating processing is performed on an Nth wafer (where N is a natural number of 2 or more) within the second liquid processing device 2000, the pre-processing on an (N+1)th wafer and the post-processing on an (N−1)th wafer within the first liquid processing device 1000, a carry-out of the (N−1)th wafer from the first liquid processing device 1000 by the substrate transfer device 17 and the carry-in of the (N+1)th wafer into the first liquid processing device 1000 by the substrate transfer device 17 are performed.

The time required for the electroless plating processing is, for example, 5 minutes, the time required for the pre-processing of the plating is, for example, 3 minutes and 30 seconds, and the time required for the post-processing of the plating is, for example, 2 minutes. That is, a cycle time of the first liquid processing device 1000 is approximately 30 seconds longer than a cycle time of the second liquid processing device 2000 (if the cycle time is not adjusted). The cycle time refers to the time from when each liquid processing device 1000 or 2000 is in a certain state to the next time when the liquid processing device 1000 or 2000 reaches the same state. Actually, the cycle time of the first liquid processing device 1000 is longer by a time period required for carrying the wafer W out of and into the first liquid processing device 1000 by the substrate transfer device 17, but it is ignored here.

In order to suppress the cross-contamination between the first liquid processing device 1000 and the second liquid processing device 2000, it is desirable to open the shutters 4102 and 4202 for a time period as short as possible. To do so, it is desirable to perform a movement of the wafer W2 from the first liquid processing device 1000 to the second liquid processing device 2000 by the first arm 3100 and a movement of the wafer W1 from the second liquid processing device 2000 to the first liquid processing device 1000 by the second arm 3200 substantially simultaneously. In other words, it is desirable to exchange the wafer W1 and the wafer W2 substantially simultaneously.

For this reason, it is desirable to increase the shorter cycle time (the cycle time of the second liquid processing device 2000) by the difference in cycle time (about 30 seconds). That is, among the processes performed in the liquid processing device having a shorter cycle time, a process that does not substantially affect the process result may be performed for a longer time.

For example, the wafer W may be left as it is for some time in a dry state. Specifically, for example, if the wafer W is left as it is in a state right after the pre-processed wafer W has been carried into the second liquid processing device 2000 (state shown in FIG. 15Q) and a cycle of the operations performed by the first liquid processing device 1000 has progressed to some extent, the electroless plating processing can be started in the second liquid processing device 2000. The wafer W may be left in a state right before the state shown in FIG. 15Q, i.e., in a state right after the lift pins 2004 receive the wafer W from the first arm 3100, the first arm 3100 is retreated into the arm standby space 4000 and the shutters 4102 and 4202 are closed.

If the cycle time of the first liquid processing device 1000 is shorter, the wafer W may be left as it is after the drying process included in the pre-processing on the wafer W is ended, after the post-processing on the wafer W is ended and after the wafer W is carried into the first liquid processing device 1000 by the substrate transfer device 17.

The cycle time may be made identical to each other by increasing the time required for the rinsing process (DIW rinsing) included in the cycle with the shorter period time or the time required for the wafer W to be left as it is in the state where the puddle of DIW has been formed on the front surface of the wafer W. If the time required for the DIW rinsing process or the time required for the wafer W to be left as it is in the state where the puddle of DIW has been formed is the same for all the wafers W, there is substantially no problem in the process result.

Then, the operations performed by the second rotational liquid processing unit 2001 from the state illustrated in FIG. 15F to the state illustrated in FIG. 15O will be described with reference to FIG. 6.

[Carry-In Process of Wafer W]

The first arm 3100 locates the wafer W right above the rotary table 100 (see FIG. 6) serving as the second spin chuck 2002 and delivers the wafer W to the lift pins 211 (see FIG. 6) corresponding to the lift pins 2004 illustrated in FIG. 15F according to the method described above with reference to FIG. 15F. While the lift pins 211 are moved down to the processing position, the wafer W is placed onto the top surface 120A of the attraction plate 120. The constituent elements in the following descriptions are illustrated in FIG. 6.

Then, the suction device 154 operates so that the attraction plate 120 is attracted onto the hot plate 140 and the wafer W is also attracted onto the attraction plate 120. Thereafter, the wafer sensor 860 starts to inspect whether the wafer W has been appropriately attracted onto the attraction plate 120.

The purge gas (e.g., $N_2$ gas) is continuously supplied to the outermost recess region 125G in the top surface of the attraction plate 120 from the purge gas supply device 155. Thus, even if there is a gap at a contact surface between the peripheral portion of the bottom surface of the wafer W and a peripheral portion of the attraction plate 120, the processing liquid cannot be introduced between the peripheral portion of the wafer W and the peripheral portion of the attraction plate 120 through the gap.

Before the carry-in of the wafer W into the second liquid processing device 2000 (liquid processing device illustrated in FIG. 6) is started, the second electrode unit 161B is located at the raised position and the plurality of first electrodes 164A of the first electrode unit 161A is in contact with the plurality of second electrodes 164B of the second electrode unit 161B. Since the power is supplied from the power feeder 300 to the heater 142 of the hot plate 140, the heater 142 of the hot plate 140 is preliminarily heated. Also, the hot plate 140 is heated by the auxiliary heater 900 to which the power is constantly supplied.

In the exemplary embodiment, the power supplied to the heater (main heater) 142 through the power feeder 300 is greater than the power supplied to the auxiliary heater 900 through a power feed device 901. That is, the auxiliary heater 900 primarily functions to suppress the decrease in temperature of the hot plate 140 when the heating by the heater 142 cannot be performed. However, the heat generation amount by the auxiliary heater 900 may be substantially identical to the heat generation amount by the heater 142.

[Wafer Heating Process]

When the wafer W is attracted onto the attraction plate 120, the supply of the power to the heater 142 of the hot plate 140 is controlled so that the temperature of the hot plate 140 can be increased to a predetermined temperature (temperature suitable for a subsequent processing on the wafer W on the attraction plate 120).

[Electroless Plating Process]

Then, the plating liquid nozzle 701 is located right above the central portion of the wafer W by the nozzle arm of the processing liquid supply 700. In this state, the temperature-controlled plating liquid is supplied to the front surface (top surface) of the wafer W from the plating liquid nozzle 701. The supply of the plating liquid continues until a liquid surface LS of the plating liquid is located sufficiently higher than the top surface of the wafer W. Here, the upper portion 181 of the periphery cover body 180 serves as a bank for suppressing the overflow of the plating liquid to the outside of the rotary table 100. This state approximately corresponds to the state illustrated in FIG. 15H.

When the puddle of the plating liquid is formed on the front surface of the wafer W, the plating liquid nozzle 701 is retreated from above the front surface of the wafer W and then, the top plate 950, at least the bottom surface of which has been heated by the heater 952, is close to the surface of the puddle of the plating liquid on the wafer W and located at the cover position where the top plate 950 covers the front surface of the wafer W. This state approximately corresponds to the states illustrated in FIG. 15I to FIG. 15L.

After the puddle is formed, the rotary table 100 is rotated (e.g., about 180°) at a low speed alternately in a forward rotation direction and a backward rotation direction. Thus, the plating liquid is stirred, and the reaction between the front surface of the wafer W and the chemical liquid can occur uniformly in the surface of the wafer W.

In general, the temperature of the peripheral portion of the wafer W tends to decrease due to the effect of air flow introduced into the liquid recovery cup. The supply of the power to the heater elements 142E for heating the peripheral region (the heating zones 143-1 to 143-4 illustrated in FIG. 7) of the wafer W among the plurality of heater elements 142E of the heater 142 may be increased. Thus, the temperature of the wafer W becomes uniform in the surface of the wafer W, and the reaction between the front surface of the wafer W and the chemical liquid can occur uniformly in the surface of the wafer W.

During the electroless plating processing, the supply of the power to the heater 142 (and the auxiliary heater 900) may be controlled based on detection values of the temperature sensors 146 embedded in the hot plate 140. If the top plate 950 can be retreated from above the rotary table 100, when the top plate 950 is located at the standby position, the supply of the power to the heater 142 (and the auxiliary heater 900) may be controlled based on detection values of the infrared thermometers 870 configured to detect the surface temperature of the wafer W.

In an exemplary embodiment, while the liquid processing module 16 (the substrate processing system 1) is driven, the supply of the power to the auxiliary heater 900 is kept constant and the temperature of the wafer W is controlled by controlling the supply of the power to the heater 142. However, by controlling the supply of the power to the auxiliary heater 900, the auxiliary heater 900 may be involved in controlling the temperature of the wafer W.

[Removal of Plating Liquid]

When the formation of the plating film is ended, the supply of the power to the heater 142 from the power feeder 300 is first stopped. Then, the second electrode unit 161B is moved down to the lowered position. By stopping the supply of the power first, it is possible to suppress the generation of sparks between the electrodes when the second electrode unit 161B is moved down.

Then, the top plate 950 is retreated to the standby position.

Then, the rotary table 100 is rotated to scatter some of the plating liquid on the wafer W to the outside by the centrifugal force. Since the inner peripheral surface 185 of the upper portion 181 of the periphery cover body 180 is inclined, the plating liquid smoothly passes over the upper portion 181 to be scattered to the outside. Here, by appropriately adjusting the rotation speed of the rotary table 100, it is possible to adjust the liquid film of the plating liquid on the wafer W to have a desired small thickness. This state approximately corresponds to the state illustrated in FIG. 15M.

The scattered plating liquid flows down through the passageway 190 between the rotary cup 188 and the periphery cover body 180 to be collected into the liquid recovery cup 800. Here, the first and second movable cup components 802 and 803 are respectively located at suitable positions to guide the scattered plating liquid to the discharge passageway (any one of the first discharge passageway 806, the second discharge passageway 807 and the third discharge passageway 808) for collecting the plating liquid.

[Carry-Out of Wafer from Second Liquid Processing Device]

Then, the switch device (three-way valve) 156 is switched to change a connection destination of a suction pipe 153W from the suction device 154 to the purge gas supply device 155. Thus, the purge gas is supplied to the plate bottom surface suction path groove 121P and also supplied to the recess regions 125W of the top surface 120A of the attraction plate 120 through the substrate bottom surface suction path groove 121W. Thus, the attraction of the wafer W onto the attraction plate 120 is released.

Along with the above-described operation, the attraction of the attraction plate 120 onto the hot plate 140 is also released. It is not necessary to release the attraction of the attraction plate 120 onto the hot plate 140 whenever the processing on each wafer W is ended. Thus, any pipe system where the attraction release is not performed may be used.

Then, the lift pins 211 are moved up to the delivery position. This state approximately corresponds to the state illustrated in FIG. 15N. Since the attraction of the wafer W onto the attraction plate 120 has been released by the purge, the wafer W can be easily separated from the attraction plate 120. For this reason, it is possible to suppress the scratches on the wafer W.

Then, the wafer W placed on the lift pins 211 is delivered to the second arm 3200. This state approximately corresponds to the state illustrated in FIG. 15O. Thereafter, the wafer sensor 860 detects that the wafer W is not present on the attraction plate 120. As such, a series of the processings on the single wafer W in the second liquid processing device 2000 is ended.

[Modification Example of Pre-Processing]

Depending on the configuration of the wafer W as the processing target object, the catalyst imparting process may not be performed. For example, when a via is formed in the wafer W, a Cu (copper) wiring layer is exposed at a bottom of the via and the via is filled by Co (cobalt) electroless plating, it is not necessary to impart a catalyst to a plating target surface. This is because Co plating can be grown from the Cu wiring layer without imparting the catalyst to the plating target surface. In this case, the pre-processing of the plating may include only the above-described pre-cleaning process, first rinsing process and drying process.

Further, when the catalyst is not imparted, the wafer W does not have to be dried before the electroless plating process. Thus, the pre-processing of the plating may include only the above-described pre-cleaning process and first rinsing process. However, at the end of the first rinsing process, the rotation number of the wafer W is appropriately adjusted and the supply of the rinse liquid is stopped to leave the thin liquid film of the rinsing liquid (DIW) on the wafer W. In this state, the wafer W may be transferred from the first liquid processing device 1000 to the second liquid processing device 2000. The liquid film of the rinsing liquid may have an adequate thickness so as not to be easily overflown from the wafer W while the wafer W is transferred and so as not to be easily dried. In this case, in the second liquid processing device 2000, it is desirable to replace the rinse liquid (DIW) remaining on the wafer W with the plating liquid by supplying the plating liquid onto the wafer W for a predetermined time period while rotating the wafer W after the wafer W is held on the rotary table 100 and before the electroless plating processing (e.g., the wafer heating process) is started.

For example, when a via is formed in the wafer W, a W (tungsten) wiring layer is exposed at a bottom of the via and the via is filled by Co (cobalt) electroless plating, it is necessary to impart a catalyst in order to grow the Co plating. Whether there is a need for imparting the catalyst in each case is well known in the art, and, thus, a detailed description thereof will be omitted.

According to the above-described exemplary embodiment, it is possible to sequentially perform the series of liquid processings (including electroless plating processing, pre-processing and post-processing) on the single wafer W with high efficiency.

If the first liquid processing device and the second liquid processing device are separate modules, it takes time and effort to transfer the wafer between the processing modules. Moreover, there is a concern about the oxidation which may cause the problem on the wafer and the film formed on the wafer during the transfer for a long time. However, in the above-described exemplary embodiment, the first liquid processing device 1000 and the second liquid processing device 2000 are provided in a single module 16. Thus, it is possible reduce the wafer transfer time between the first liquid processing device 1000 and the second liquid processing device 2000. Therefore, the problem caused by the long transfer time can be solved. The above-described advantages can also be obtained even when the processings are not simultaneously performed in both the first liquid processing device and the second liquid processing device.

Further, according to the above-described exemplary embodiment, two wafers are exchanged substantially simultaneously by the first arm 3100 and the second arm 3200. Therefore, it is possible to greatly reduce the wafer transfer time between the first liquid processing device 1000 and the second liquid processing device 2000.

Further, according to the above-described exemplary embodiment, the first liquid processing device 1000 and the second liquid processing device 2000 are partitioned by the partition walls 4100 and 4200. Therefore, it is possible to suppress the cross-contamination between the first liquid processing device 1000 and the second liquid processing device 2000.

Furthermore, according to the above-described exemplary embodiment, while the electroless plating processing is performed in the second liquid processing device 2000, the pre-processing and the post-processing may be performed in the first liquid processing device 1000. Thus, it is possible to perform the series of liquid processings with high efficiency and improve the throughput of the entire substrate processing system. Also, it is possible to improve the substantial operation rate of the devices included in the first liquid processing device 1000 and the second liquid processing device 2000. Thus, the hardware resources can be efficiently used.

Moreover, according to the above-described exemplary embodiment, since the scattering drying is not performed in the second liquid processing device 2000, it is not necessary to rotate the rotary motor at a high speed. Therefore, it is possible to reduce the cost of the rotary motor of the second liquid processing device 2000.

Also, according to the above-described exemplary embodiment, the first liquid processing device 1000 has the configuration suitable for the cleaning processing and the second liquid processing device 2000 has the configuration suitable for the electroless plating processing. In particular, since the second liquid processing device 2000 has the heater embedded in the rotary table 100, the wafer W can be efficiently heated and the accuracy of the temperature control can be improved.

[Modification Example of Plating Processing]

After the (first) plating processing is performed on the wafer W in the second liquid processing device 2000 and before the post-processing of the plating is performed on the wafer W in the first liquid processing device 1000, the wafer W may be returned back to the first liquid processing device 1000 by the second arm 3200 and subjected to an intermediate cleaning process in the first liquid processing device 1000 and then, the wafer W may be carried into the second liquid processing device 2000 by the first arm 3100 and subjected to a (second) plating processing. In this case, when the second plating processing is performed on an Nth wafer W in the second liquid processing device 2000, the a post-processing on the (N−1)th wafer W and the pre-processing on the (N+1)th wafer W may be performed in the first liquid processing device 1000.

When the Cu (copper) wiring layer is exposed at the bottom of the deep via and the via is filled by the Co (cobalt) electroless plating, the intermediate cleaning processing may be performed to remove abnormal precipitates caused by the first plating processing. Then, the second plating processing may be performed to fill the via with a high quality plating layer.

[Modification Example of Arm]

Figure 16A:
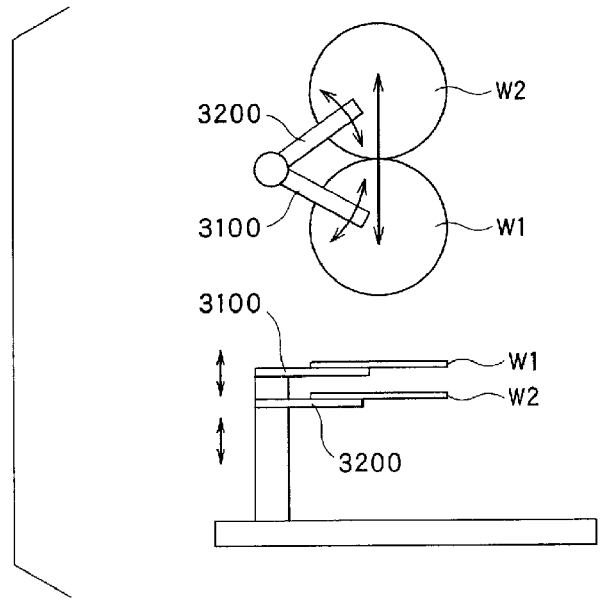
FIG. 16A illustrates a modification example of a first arm and a second arm provided in the liquid processing module.
Figure 16B:
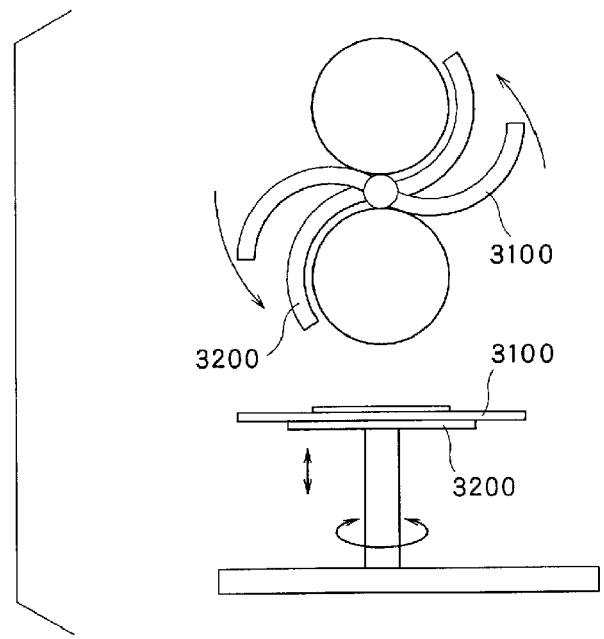
FIG. 16B illustrates another modification example of the first arm and the second arm provided in the liquid processing module.

The configurations of the first arm 3100 and the second arm 3200 are not limited to the above descriptions and may have the configurations as illustrated in FIG. 16A and FIG. 16B. In each of FIG. 16A and FIG. 16B, an upper part is a schematic plan view of the first arm 3100 and the second arm 3200 and a lower part is a schematic side view of these arms 3100 and 3200.

In a modification example illustrated in FIG. 16A, the first arm 3100 and the second arm 3200 are configured to be rotated around the same rotation axis when viewed from the top. The first arm 3100 and the second arm 3200 are located at different height positions as in the above-described exemplary embodiment.

In a modification example illustrated in FIG. 16B, the first arm 3100 and the second arm 3200 are located at the same height position. The first arm 3100 and the second arm 3200 are configured to be rotated around the same rotation axis when viewed from the top. The first arm 3100 and the second arm 3200 are arranged in a point symmetry with respect to the rotation axis.

The exemplary embodiments disclosed herein are illustrative in all aspects and do not limit the present disclosure. The above-described exemplary embodiments may be omitted, substituted, or changed in various forms without departing from the scope and spirit of the appended claims.

The substrate to be processed is not limited to the semiconductor wafer and may be another substrate, such as a glass substrate or a ceramic substrate, used in the manufacture of the semiconductor device.

According to the present disclosure, it is possible to efficiently perform the series of liquid processings including the plating processing and at least one of the pre-processing or the post-processing of the plating processing.

We claim:

1. A substrate processing apparatus, comprising:
   a liquid processing module, provided with a carry-out/in opening for a substrate, including therein a first liquid processing device and a second liquid processing device provided at a position farther from the carry-out/in opening than the first liquid processing device;
   a module-outside transfer device configured to carry the substrate out from and into the liquid processing module; and
   a module-inside transfer device disposed between the first liquid processing device and the second liquid processing device, and configured to transfer the substrate between the first liquid processing device and the second liquid processing device,
   wherein the first liquid processing device is equipped with a first holder configured to hold the substrate,
   the second liquid processing device is equipped with a second holder configured to hold the substrate,
   the second liquid processing device is configured to perform a plating processing on the substrate held by the second holder, and
   the first liquid processing device is configured to perform at least a post-cleaning processing performed after the plating processing on the substrate held by the first holder,
   wherein the module-inside transfer device comprises a first arm and a second arm which are configured to pivot in a horizontal plane by a rotary actuator, and
   the first arm and the second arm are located at different height positions such that the first arm and the second arm do not interfere with each other when the first arm and the second arm are simultaneously moved.

2. The substrate processing apparatus of claim 1, further comprising:
   a controller configured to control an operation of the substrate processing apparatus,
   wherein the controller controls
   the module-outside transfer device to carry the substrate into the first liquid processing device,
   the module-inside transfer device to transfer the substrate from the first liquid processing device to the second liquid processing device,
   the second liquid processing device to perform the plating processing on the substrate by supplying a plating liquid onto the substrate and heating the plating liquid,
   the module-inside transfer device to transfer the substrate from the second liquid processing device to the first liquid processing device,
   the first liquid processing device to perform the post-cleaning processing on the substrate, and
   the module-outside transfer device to carry the substrate out from the liquid processing module.

3. The substrate processing apparatus of claim 2,
   wherein the controller controls the first liquid processing device to perform a pre-processing including a pre-cleaning process performed before the plating processing on the substrate, after the substrate is carried into the first liquid processing device by the module-outside transfer device and before the substrate is transferred from the first liquid processing device to the second liquid processing device by the module-inside transfer device.

4. The substrate processing apparatus of claim 1, further comprising:
   a controller configured to control an operation of the substrate processing apparatus,
   wherein the controller controls
   the module-outside transfer device to carry the substrate into the first liquid processing device,
   the first liquid processing device to perform a pre-processing including a pre-cleaning process performed before the plating processing on the substrate,
   the module-inside transfer device to transfer the substrate from the first liquid processing device to the second liquid processing device,
   the second liquid processing device to perform a first plating processing on the substrate by supplying a plating liquid onto the substrate and heating the plating liquid,
   the module-inside transfer device to transfer the substrate from the second liquid processing device to the first liquid processing device,
   the first liquid processing device to perform an intermediate cleaning processing on the substrate,
   the module-inside transfer device to transfer the substrate from the first liquid processing device to the second liquid processing device,
   the second liquid processing device to perform a second plating processing on the substrate by supplying a plating liquid onto the substrate and heating the plating liquid,
   the module-inside transfer device to transfer the substrate from the second liquid processing device to the first liquid processing device,
   the first liquid processing device to perform the post-cleaning processing on the substrate, and
   the module-outside transfer device to carry the substrate out from the liquid processing module.

5. The substrate processing apparatus of claim 3,
   wherein the pre-processing includes a palladium imparting process of imparting palladium to the substrate.

6. The substrate processing apparatus of claim 2,
   wherein the second holder of the second liquid processing device is provided with a heater, and
   when the plating processing is performed on the substrate, the substrate and the plating liquid are heated by the heater.

7. The substrate processing apparatus of claim 2,
   wherein the second liquid processing device is provided with a top plate and a top plate moving mechanism, and when the plating processing is performed on the substrate, the controller controls the top plate to cover the substrate held by the second holder and supplied with the plating liquid.

8. The substrate processing apparatus of claim 7, wherein the top plate is provided with a heater, and when the plating processing is performed on the substrate, the controller controls the heater to heat at least a bottom surface of the top plate.

9. The substrate processing apparatus of claim 7, wherein the top plate is provided with an inert gas supply, and when the plating processing is performed on the substrate, the controller controls the inert gas supply to supply an inert gas into at least a space between the top plate and the substrate.

10. The substrate processing apparatus of claim 7, wherein an inert gas supply is provided at a peripheral portion of the second holder of the second liquid processing device, and when the plating processing is performed on the substrate, the controller controls the inert gas supply to supply an inert gas into at least a space between the top plate and the substrate.

11. The substrate processing apparatus of claim 7, further comprising:

an inert gas supply configured to supply an inert gas to the second liquid processing device, wherein at least when the plating processing is performed on the substrate, the controller controls the inert gas supply to supply the inert gas to a space within the second liquid processing device.

\* \* \* \* \*